US012690477B2

(12) United States Patent　　　　(10) Patent No.:　US 12,690,477 B2
Tsukamoto　　　　　　　　　　　　　(45) Date of Patent:　　Jul. 21, 2026

(54) WIRING SUBSTRATE, SEMICONDUCTOR DEVICE, AND METHOD OF MANUFACTURING THE WIRING SUBSTRATE

(71) Applicant: SHINKO ELECTRIC INDUSTRIES CO., LTD., Nagano (JP)

(72) Inventor: Kosuke Tsukamoto, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 445 days.

(21) Appl. No.: 18/347,167

(22) Filed: Jul. 5, 2023

(65) Prior Publication Data

US 2024/0030149 A1　　Jan. 25, 2024

(30) Foreign Application Priority Data

Jul. 19, 2022　　(JP) ................................. 2022-114848

(51) Int. Cl.
| | |
|---|---|
| *H10W 70/65* | (2026.01) |
| *H10W 70/05* | (2026.01) |
| *H10W 70/60* | (2026.01) |
| *H10W 70/63* | (2026.01) |
| *H10W 70/685* | (2026.01) |
| *H10W 90/00* | (2026.01) |

(52) U.S. Cl.
CPC ........... *H10W 70/65* (2026.01); *H10W 70/05* (2026.01); *H10W 70/095* (2026.01);
(Continued)

(58) Field of Classification Search
CPC ............. H01L 23/5386; H01L 21/4857; H01L 23/5383; H01L 25/0655; H01L 23/5381;
(Continued)

(56) References Cited

U.S. PATENT DOCUMENTS

| | | | |
|---|---|---|---|
| 5,110,664 | A | 5/1992 | Nakanishi et al. |
| 2014/0225275 | A1 | 8/2014 | Shimizu et al. |

(Continued)

FOREIGN PATENT DOCUMENTS

| | | |
|---|---|---|
| JP | H3-41757 A | 2/1991 |
| JP | 2014-154800 A | 8/2014 |

(Continued)

OTHER PUBLICATIONS

Japanese Office Action dated Apr. 28, 2026 issued in corresponding Japanese application No. 2022-114848; English machine translation included (8 pages).

*Primary Examiner* — Evan G Clinton

(74) *Attorney, Agent, or Firm* — Rankin, Hill & Clark LLP

(57)　　　　ABSTRACT

A wiring substrate includes a first insulating layer, a first wiring layer that is provided on the first insulating layer, and a thin film layer that is provided on one of surfaces of the first insulating layer and that includes a second insulating layer that is different from the first insulating layer and a second wiring layer. The thin film layer includes a first pad and a second pad that are provided on an opposite surface of a surface that faces the first insulating layer, a first via that is electrically connected to the first pad, and a second via that is electrically connected to the second pad. The first wiring layer includes thicker than the second wiring layer, and includes a transmission wiring that electrically connects between the first via and the second via.

8 Claims, 15 Drawing Sheets

(52) U.S. Cl.
CPC ........ *H10W 70/611* (2026.01); *H10W 70/635*
(2026.01); *H10W 70/685* (2026.01); *H10W*
*90/401* (2026.01); *H10W 90/00* (2026.01);
*H10W 90/701* (2026.01)

(58) Field of Classification Search
CPC ... H10W 70/65; H10W 70/05; H10W 70/685;
H10W 90/401; H10W 70/69
See application file for complete search history.

(56) References Cited

U.S. PATENT DOCUMENTS

| | | | |
|---|---|---|---|
| 2014/0234999 | A1 | 8/2014 | Kim et al. |
| 2014/0374150 | A1 | 12/2014 | Inagaki et al. |
| 2017/0256482 | A1 | 9/2017 | Furuichi et al. |
| 2018/0035534 | A1* | 2/2018 | Taniguchi ............ H05K 1/0298 |
| 2018/0350731 | A1* | 12/2018 | Hu .................... H01L 23/49838 |
| 2020/0092993 | A1 | 3/2020 | Taneda et al. |
| 2021/0202396 | A1* | 7/2021 | Wu ......................... H01L 25/50 |
| 2022/0005787 | A1* | 1/2022 | Han ................. H01L 23/49833 |
| 2022/0415737 | A1* | 12/2022 | Wu .................... H01L 21/4853 |

FOREIGN PATENT DOCUMENTS

| | | | |
|---|---|---|---|
| JP | 2015-005612 | A | 1/2015 |
| JP | 2017-157666 | A | 9/2017 |
| JP | 2019-197797 | A | 11/2019 |
| JP | 2020-047735 | A | 3/2020 |
| JP | 2020-202278 | A | 12/2020 |

* cited by examiner

FIG.1

| | INSULATING LAYER IN THIN FILM LAYER | INSULATING LAYER | ADHESIVE LAYER |
|---|---|---|---|
| DIELECTRIC CONSTANT Dk | 3.2 TO 4.6 | 3.2 TO 4.6 | 3.2 TO 4.6 |
| DIELECTRIC LOSS TANGENT Df | 0.01 TO 0.06 | 0.004 TO 0.02 | 0.004 TO 0.02 |

FIG.4

|  | CONNECTOR TERMINAL | CHIP TERMINAL |
|---|---|---|
| SHAPE | RECTANGULAR SHAPE | CIRCULAR SHAPE |
| ELECTRODE SIZE | 0.1x0.1 TO 2x2 mm | $\Phi 20\ \mu m$ TO $\Phi 100\ \mu m$ |
| ELECTRODE THICKNESS | 5 TO 20 $\mu m$ | 5 TO 20 $\mu m$ |
| ELECTRODE PITCH | 0.1 TO 2 mm | 30 TO 200 $\mu m$ |

FIG.9

WIRING SUBSTRATE, SEMICONDUCTOR DEVICE, AND METHOD OF MANUFACTURING THE WIRING SUBSTRATE

CROSS-REFERENCE TO RELATED APPLICATION

This application is based upon and claims the benefit of priority of the prior Japanese Patent Application No. 2022-114848, filed on Jul. 19, 2022, the entire contents of which are incorporated herein by reference.

FIELD

The embodiments discussed herein are related to a wiring substrate, a semiconductor device, and a method of manufacturing the wiring substrate.

BACKGROUND

For example, there is a known semiconductor device constructed by manufacturing a wiring substrate, such as an organic interposer substrate, in which a thin film layer is formed on an insulating layer that is formed by using a thermosetting resin, that is mounted on a build-up substrate. FIG. 16 is a diagram illustrating one example of a semiconductor device 100 that is conventionally used. The semiconductor device 100 illustrated in FIG. 16 includes a build-up substrate 102 and a wiring substrate 105 that is mounted on the build-up substrate 102. Furthermore, on the surface of the build-up substrate 102, a solder resist 106 that suppresses adhesion of solder occurring at the time at which the wiring substrate 105 is mounted is provided.

The wiring substrate 105 includes an insulating layer 111, a thin film layer 112, an adhesive layer 113. The insulating layer 111 includes a first conductive layer 114 that is arranged on one of the surfaces of the insulating layer 111, a second conductive layer 115 that is arranged on the other of the surfaces of the insulating layer 111, and a first via 111A that electrically connects between the first conductive layer 114 and the second conductive layer 115.

The first conductive layer 114 includes a pad 114A that is electrically connected to a pad 102A that is disposed on the build-up substrate 102. The second conductive layer 115 includes a pad 115A that electrically connects between a first via 111A formed in an insulating layer 111 and a second via 112A formed in the thin film layer 112.

The thin film layer 112 includes a thin film wiring layer in which, for example, wiring layers and insulating layers are sequentially laminated, a third conductive layer 116 that is laminated on the thin film wiring layer, a second via 112A that electrically connects between the wiring layer included in the thin film wiring layer and the third conductive layer 116. The thin film wiring layer includes a first insulating layer 161, a first wiring layer 162 that is provided on the first insulating layer 161, a second insulating layer 163 that covers the first wiring layer 162 and that is laminated on the first insulating layer 161, a second wiring layer 164 that is provided on the second insulating layer 163, and a third insulating layer 165 that covers the second wiring layer 164 and that is laminated on the second insulating layer 163. The third conductive layer 116 includes a pad 116A that is electrically connected to a chip terminal of a chip 103 by way of solder 118.

The build-up substrate 102 includes a pad 102A1 (102A) that is electrically connected to the pad 114A that is included in the first conductive layer 114 disposed on the wiring substrate 105, a pad 102A2 (102A) that is electrically connected to a connector 104 that is mounted on the build-up substrate 102. In addition, the build-up substrate 102 includes a substrate via 102C that is electrically connected to the pad 102A. In addition, the build-up substrate 102 includes a transmission wiring 102B that electrically connects between a substrate via 102C1 (102C) that is connected to the pad 102A1 that is connected to the chip 103 and a substrate via 102C2 (102C) that is connected to the pad 102A2 that is connected to the connector 104. In addition, a portion between the pad 102A1 included in the build-up substrate 102 and the pad 114A disposed on the wiring substrate 105 is electrically connected by using solder 117. In addition, a portion between the pad 102A2 included in the build-up substrate 102 and the connector 104 is electrically connected by using the solder 117.

The transmission wiring 102B is a line that electrically connects between the chip 103 that is mounted on the wiring substrate 105 and the connector 104 that is mounted on the build-up substrate 102, and that transmits a high-speed serial signal between the chip 103 and the connector 104. Furthermore, the line/space of the transmission wiring 102B are, for example, about 15 μm/15 μm, and the wiring thickness is, for example, 15 μm.

Then, the chip 103 on the wiring substrate 105 transmits the high-speed signal to the connector 104 by way of a path along the pad 116A→the second via 112A→the pad 115A→the first via 111A→the pad 114A→the solder 117→the pad 102A1→the substrate via 102C1→the transmission wiring 102B→the substrate via 102C2→the pad 102A2.

Patent Document 1: Japanese Laid-open Patent Publication No. 2020-202278

Patent Document 2: Japanese Laid-open Patent Publication No. 2015-5612

Patent Document 3: Japanese Laid-open Patent Publication No. 2020-47735

However, in the semiconductor device 100, in the case where a high-speed signal is transmitted between the chip 103 and the connector 104, a reflection loss and an insertion loss occur in the high-speed signal when the high-speed signal passes through the path formed using the transmission wiring 102B.

SUMMARY

According to an aspect of an embodiment, a wiring substrate includes a first insulating layer, a first wiring layer that is provided on the first insulating layer, and a thin film layer. The thin film layer is provided on one of surfaces of the first insulating layer and includes a second insulating layer that is different from the first insulating layer and a second wiring layer. The thin film layer includes a first pad and a second pad that are provided on an opposite surface of a surface that faces the first insulating layer, a first via that is electrically connected to the first pad, and a second via that is electrically connected to the second pad. The first wiring layer is thicker than the second wiring layer. The first wiring layer includes a transmission wiring that electrically connects between the first via and the second via.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a diagram illustrating one example of a semiconductor device according to a first embodiment;

FIG. 4 is a diagram illustrating one example of characteristics of a connector terminal and a chip terminal;

FIG. 9 is a diagram illustrating one example of a semiconductor device according to a second embodiment;

DESCRIPTION OF EMBODIMENTS

Figures 2, 3:
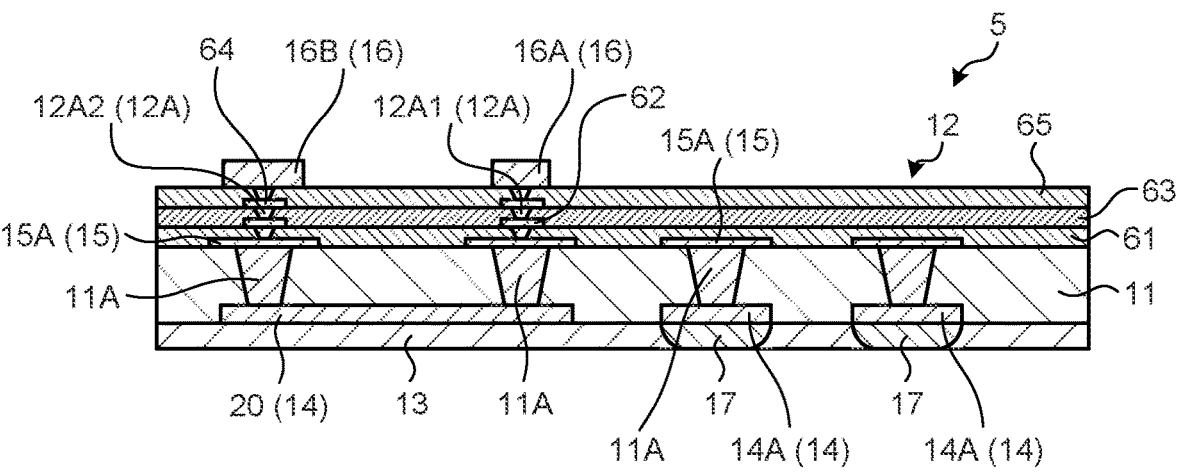
FIG. 2 is a schematic cross-sectional diagram illustrating one example of a wiring substrate.
FIG. 3 is a diagram illustrating one example of a dielectric constant and a dielectric loss tangent of each of insulating layers.

Preferred embodiments of a wiring substrate, a semiconductor device, and a method of manufacturing the wiring substrate disclosed in the present invention will be explained in detail below with reference to the accompanying drawings. Furthermore, the present invention is not limited to the embodiments.

First Embodiment

Figure 1:
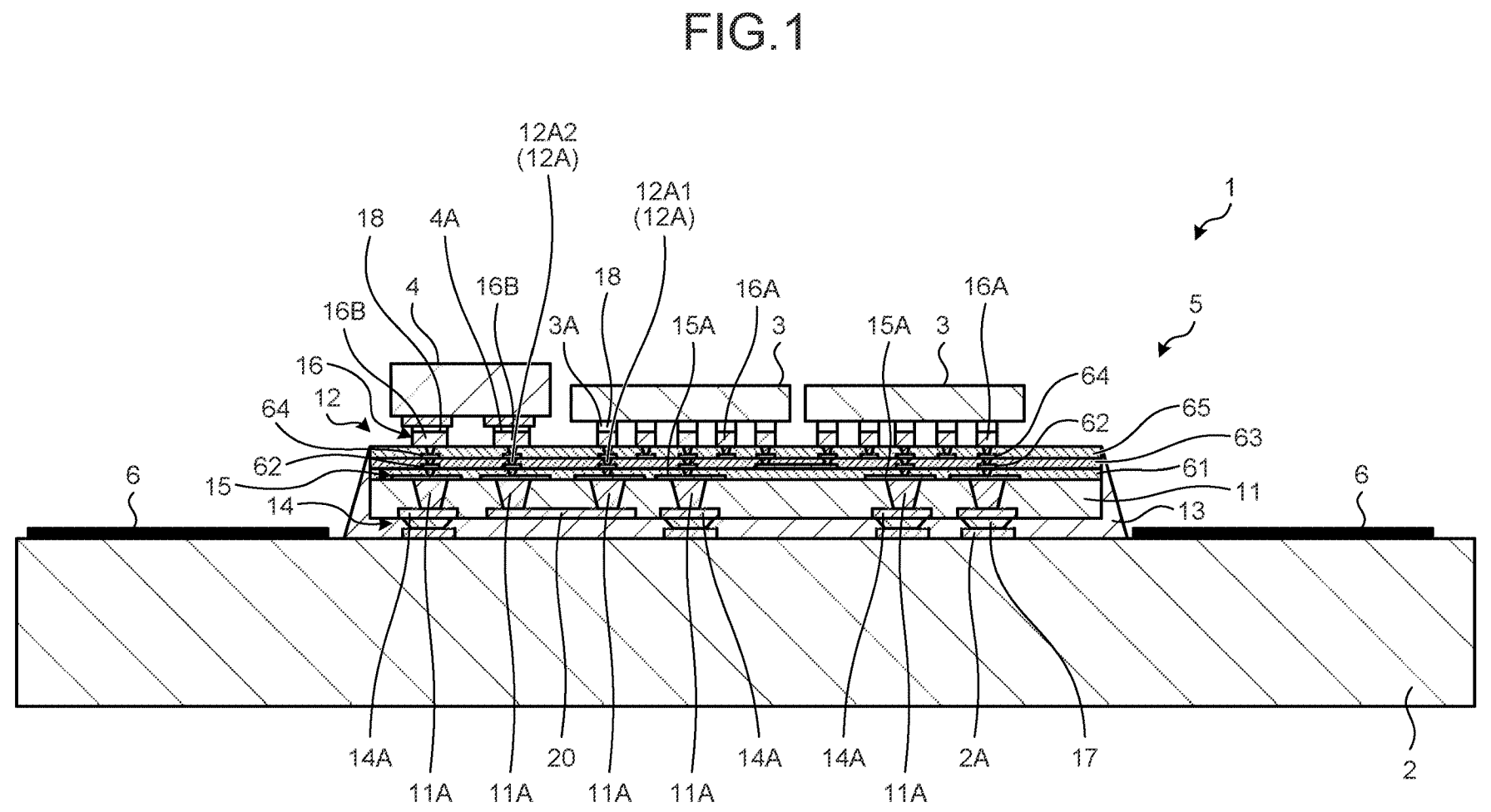

FIG. 1 is a diagram illustrating one example of a semiconductor device 1 according to a first embodiment. The semiconductor device 1 illustrated in FIG. 1 includes a build-up substrate 2, and a wiring substrate 5 on which a plurality of chips 3 and connectors 4 are mounted, and is constituted by mounting the wiring substrate 5 on the build-up substrate 2. Furthermore, on the surface of the build-up substrate 2, a solder resist 6 that suppresses adhesion of solder occurring at the time at which the wiring substrate 5 is mounted is provided.

FIG. 2 is a schematic cross-sectional diagram illustrating one example of the wiring substrate 5. The wiring substrate 5 includes an insulating layer 11, a thin film layer 12, and an adhesive layer 13. The planer shape of the wiring substrate 5 may be, for example, a square shape with 40 mm square. However, the shape is not limited to this, the wiring substrate 5 may be an arbitrary planer shape.

The insulating layer 11 includes a first conductive layer 14 that is arranged on one of the surfaces of the insulating layer 11, a second conductive layer 15 that is arranged on the other of the surfaces of the insulating layer 11, and a first via 11A that electrically connects between the first conductive layer 14 and the second conductive layer 15. The thickness of the insulating layer 11 is, for example, about 45 μm to 80 μm. The insulating layer 11 is, for example, a first insulating layer. The first conductive layer 14 is, for example, the first wiring layer.

The first conductive layer 14 includes a pad 14A that is electrically connected to the build-up substrate 2, and a transmission wiring 20. The first conductive layer 14 is a conductive layer disposed at the lowermost layer and is covered by the insulating layer 11. The first conductive layer 14 is a circular pad having a planer shape with a diameter of, for example, about 150 μm; however, the first conductive layer 14 may include a wiring pattern. An interval of the adjacent first conductive layer 14 may be set to, for example, about 200 μm. The material used for the first conductive layer 14 may be, for example, copper (Cu), or the like. The thickness of the first conductive layer 14 may be set to, for example, about 10 to 20 μm. The second conductive layer 15 includes a pad 15A that electrically connects between the first via 11A formed in the insulating layer 11 and a second via 12A formed in the thin film layer 12.

The thin film layer 12 includes a thin film wiring layer in which wiring layers and insulating layers are sequentially laminated, a third conductive layer 16 that is laminate on the thin film wiring layer, and the second via 12A that electrically connects between, for example, the wiring layer included in the thin film wiring layer and the third conductive layer 16. The second via 12A electrically connects between the third conductive layer 16 and the second conductive layer 15. The third conductive layer 16 includes a first pad 16A that is electrically connected to a chip terminal of the chip 3, and a second pad 16B that is electrically connected to a connector terminal of the connector 4.

The thin film wiring layer includes a first insulating layer 61, a first wiring layer 62 that is provided on the first insulating layer 61, a second insulating layer 63 that covers the first wiring layer 62 and that is laminated on the first insulating layer 61, a second wiring layer 64 that is provided on the second insulating layer 63, and a third insulating layer 65 that covers the second wiring layer 64 and that is laminate on the second insulating layer 63. Furthermore, in the above, as an example, the thin film wiring layer has a 5-layered structure constituted of the first insulating layer 61, the first wiring layer 62, the second insulating layer 63, the second wiring layer 64, and the third insulating layer 65; however, the structure is not limited to the 5-layered structure, and appropriate modifications are possible.

The first insulating layer 61 is formed on one of the surfaces of the insulating layer 11 such that the first insulating layer 61 covers the second conductive layer 15. The first wiring layer 62 is formed on one of the sides of the first insulating layer 61, and is electrically connected to the second conductive layer 15. The second insulating layer 63 is formed on one of the surfaces of the first insulating layer 61 such that the second insulating layer 63 covers the first wiring layer 62. The second wiring layer 64 is formed on one of the sides of the second insulating layer 63, and is electrically connected to the first wiring layer 62. The third insulating layer 65 is formed on one of the surfaces of the second insulating layer 63 such that the third insulating layer 65 covers the second wiring layer 64. Furthermore, the thickness of each of the first wiring layer 62 and the second wiring layer 64 included in the thin film wiring layer is set to, for example, about 1 to 3 μm. The first insulating layer 61, the second insulating layer 63, and the third insulating layer 65 included in the thin film layer 12 corresponds to, for example, a second insulating layer. In addition, the first wiring layer 62 and the second wiring layer 64 included in the thin film layer 12 correspond to, for example, a second wiring layer.

The transmission wiring 20 included in the first conductive layer 14 is arranged in the first conductive layer 14 included in the insulating layer 11 located at a boundary portion disposed between the insulating layer 11 and the adhesive layer 13. The wiring thickness of the first conductive layer 14 is thicker than that of the first wiring layer 62 or the second wiring layer 64 included in the thin film wiring layer. The transmission wiring 20 electrically connects between the first via 11A that is electrically connected to a first via 12A1 (12A) that is connected to the first pad 16A, and the first via 11A that is electrically connected to a second via 12A2 (12A) that is connected to the second pad 16B. In other words, the transmission wiring 20 is a serial transmission path that electrically connects between the chip 3 that is connected to the first pad 16A and the connector 4 that is connected to the second pad 16B, and that transmits, for example, a high-speed serial signal.

In addition, in the present embodiment, for the sake of convenience, on the wiring substrate 5, the third conductive layer 16 side is referred to as an upper side or one side, whereas the adhesive layer 13 side is referred to as a lower side or the other side. Furthermore, the surface of each of the portions disposed on the third conductive layer 16 side is referred to as one of the surfaces or an upper surface, whereas the surface each of the portions disposed on the adhesive layer 13 side is referred to as the other of the surfaces or a lower surface. However, the wiring substrate 5 is able to be used in an upside down state, or is able to be arranged at an arbitrary angle. In addition, it is assumed that a planar view indicates that a target object is viewed from the normal direction of the upper surface of the insulating layer 11, and it is assumed that a planer shape indicates a shape of the target object viewed from the normal direction of the upper surface of the insulating layer 11.

The insulating layer 11 covers the first conductive layer 14. Furthermore, the insulating layer 11 is not limited to a single layer, but may be a layer in which a plurality of insulating resins are laminated. The insulating layer 11 is an insulating layer formed of, for example, a non-photosensitive thermosetting resin as a main component. Furthermore, examples of the non-photosensitive thermosetting resin include, for example, an epoxy-based resin, an imide-based resin, a phenolic-based resin, a cyanate-based resin, and the like. In addition, it is preferable that the insulating layer 11 includes, for example, a reinforcement member, such as a glass fiber or an aramid fiber. The insulating layer 11 may cover only the side surfaces of the first conductive layer 14, but preferably covers the upper surface and the side surfaces of the first conductive layer 14. In other words, the lower surface of the first conductive layer 14 is exposed from the lower surface of the insulating layer 11, and the lower surface of the insulating layer 11 and the lower surface of the first conductive layer 14 can be, for example, flush with each other.

A solder layer 17 is formed on the lower surface of the first conductive layer 14. The material used for the solder layer 17 may be, for example, SnBi solder, or the like. The thickness of the solder layer 17 may be set to, for example, about 15 to 25 μm. The solder layer 17 is covered by the adhesive layer 13 that is formed on the lower surface of the insulating layer 11. The material used for the adhesive layer 13 may be, for example, an epoxy-based insulation-property resin, or the like. The thickness of the adhesive layer 13 may be set to, for example, about 25 to 30 μm. Furthermore, the solder layer 17 and the adhesive layer 13 are not component elements essential for the wiring substrate 5, and may be formed as needed.

The first via 11A is via wiring that is embedded in the insulating layer 11. In more detail, the first via 11A is the via wiring that is filled inside a via hole by passing through the insulating layer 11 and exposing the upper surface of the first conductive layer 14, and is electrically connected to the first conductive layer 14. The via hole can be a recess portion that has an inverted truncated cone shape and in which the diameter of the opening portion that is opened on the thin film layer 12 side is larger than the diameter of the bottom surface of the opening portion that is formed by the upper surface of the first conductive layer 14. The diameter of the opening portion of the via hole may be set to, for example, about 60 to 70 μm.

The upper surface of the first via 11A is exposed from the upper surface of the insulating layer 11. The upper surface of the first via 11A can be, for example, flush with the upper surface of the insulating layer 11. The upper surface of the first via 11A is directly bonded to the lower surface of the thin film layer 12. In addition, the lower surface of the first via 11A is directly bonded to the first conductive layer 14 inside the insulating layer 11. The material of the first via 11A is the same material as that used for, for example, the first conductive layer 14.

The first via 11A is constituted from only the via wiring that is formed in the via hole in the insulating layer 11. In other words, a wiring pattern that is integrally formed on the upper surface of the insulating layer 11 is not provided in the first via 11A. The first via 11A and the thin film layer 12 are electrically connected, but are not formed in an integrated manner. Specifically, in a manufacturing method that will be described later, the thin film layer 12 is constituted by sequentially laminating the wiring layers and the insulating layers. The wiring layer included in the thin film layer 12 is a high-density wiring pattern (for example, the line/space are about 3 μm/3 μm) formed by using a semi-additive method.

The wiring layer included in the thin film layer 12 is formed on the upper surface of the insulating layer 11. The wiring layer is directly formed on the upper surface of the insulating layer 11, and includes wiring (a wiring pattern or a pad) that is electrically connected to the first conductive layer 14 by way of the first via 11A. That is, a part of the lower surface of the wiring layer included in the thin film layer 12 is in contact with the upper surface of the first via 11A, and both are electrically connected. The material used for the wiring layer included in the thin film layer 12 may be, for example, copper (Cu), or the like. The thin film layer 12 is a laminated film in which a plurality of conductor layers are laminated. The thin film layer 12 has a wiring density that is higher than that of the first conductive layer 14 (i.e., the line/space are narrow), and is thinner than the first conductive layer 14. In the present application, a wiring layer having the line/space equal to or larger than 8 μm/8 μm is defined as the wiring layer having a high wiring density. The line/space of the thin film layer 12 may be set to, for example, about 1 μm/1 μm to 3 μm/3 μm.

In addition, the line indicated by the line/space denotes a wiring thickness, and the space indicated by the line/space denotes an interval (wiring interval) between the adjacent pieces of wiring. For example, in the case where the line/space are represented by 2 μm/2 μm, this indicates that the wiring thickness is 2 μm and the interval between the adjacent pieces of wiring is 2 μm.

The first insulating layer 61 included in the thin film layer 12 is an insulating layer constituted of a photosensitive insulation-property resin as a main component. A description indicating that "the photosensitive insulation-property resin is used as the main component" means that another component, such as a filler, may be contained other than the photosensitive insulation-property resin. For example, the first insulating layer 61 may contain a filler, such as silica (SiO$_2$).

The first insulating layer 61 included in the thin film layer 12 is formed so as to cover the second via 12A. Examples of the photosensitive insulation-property resin used for the first insulating layer 61 included in the thin film layer 12 include a phenolic-based resin, a polyimide-based resin, and the like. The thickness of the first insulating layer 61 may be set to, for example, about 5 to 10 μm. Furthermore, as described above, the thickness of the insulating layer 11 is, for example, about 45 μm to 80 μm, so that the thickness of the insulating layer 11 is considerably thicker than that of the first insulating layer included in the thin film layer 12.

The first wiring layer 62 included in the thin film layer 12 is a wiring layer that is provided on the first insulating layer 61 and that includes the via wiring and the wiring pattern. Furthermore, the thickness of the first wiring layer 62 is set to, for example, about 1 to 3 μm. The line/space of the first wiring layer 62 may be set to, for example, about 1 μm/1 μm to 3 μm/3 μm, but the line/space may be further narrower than those of the second via 12A. The first wiring layer 62 includes the via wiring that is filled inside the second via 12A by passing through the first insulating layer 61 and exposing the upper surface of the second conductive layer 15, and the wiring pattern that is formed on the upper surface of the first insulating layer 61. The second via 12A can be a recess portion that has an inverted truncated cone shape and in which the diameter of the opening portion opened on the second insulating layer 63 side is larger than the diameter of the bottom surface of the opening portion that is formed by the upper surface of the second conductive layer 15. The diameter of the opening portion of the second via 12A may be set to, for example, about 10 to 20 μm. The material used for the first wiring layer 62 and the thickness of the wiring pattern constituting the first wiring layer 62 can be the same as those of, for example, the second conductive layer 15.

The second insulating layer 63 included in the thin film layer 12 is an insulating layer that covers the first wiring layer 62 and that is laminated on the first insulating layer 61 and constituted of a photosensitive insulation-property resin as a main component. A description indicating that "the photosensitive insulation-property resin is used as the main component" means that another component, such as a filler, may be contained other than the photosensitive insulation-property resin. For example, the second insulating layer 63 may contain silica (SiO$_2$) or the like as a filler.

The second insulating layer 63 included in the thin film layer 12 is formed so as to cover the second via 12A. Examples of the photosensitive insulation-property resin used for the second insulating layer 63 included in the thin film layer 12 include a phenolic-based resin, a polyimide-based resin, and the like. The thickness of the second insulating layer 63 may be set to, for example, about 5 to 10 μm. Furthermore, as described above, the thickness of the insulating layer 11 is, for example, about 45 μm to 80 μm, so that the thickness of the insulating layer 11 is considerably thicker than that of the second insulating layer 63 included in the thin film layer 12.

The second wiring layer 64 included in the thin film layer 12 is the wiring layer that is provided on the second insulating layer 63 and that includes the via wiring and the wiring pattern. Furthermore, the thickness of the second wiring layer 64 may be set to, for example, about 1 to 3 μm. The line/space of the second wiring layer 64 may be set to, for example, about 1 μm/1 μm to 3 μm/3 μm, but it is possible to further reduce the line/space than those of the second via 12A. The second wiring layer 64 includes a via wiring that is filled inside the second via 12A by passing through the second insulating layer 63 and exposing the upper surface of the first wiring layer 62, and the wiring pattern that is formed on the upper surface of the second insulating layer 63. The second via 12A can be a recess portion that has an inverted truncated cone shape and in which the diameter of the opening portion opened on the third insulating layer 65 side is larger than the diameter of the bottom surface of the opening portion that is formed by the upper surface of the second wiring layer 64. The diameter of the opening portion of the second via 12A may be set to, for example, about 10 to 20 μm. The material used for the second wiring layer 64 and the thickness of the wiring pattern constituting the second wiring layer 64 can be the same as those of, for example, the second conductive layer 15. The line/space of the wiring pattern constituting the second wiring layer 64 can be the same as those of, for example, the first wiring layer 62.

The third insulating layer 65 included in the thin film layer 12 is an insulating layer that covers the second wiring layer 64 and that is laminated on the second insulating layer 63, and is made of a photosensitive insulation-property resin as a main component. A description indicating that "the photosensitive insulation-property resin is used as the main component" means that another component, such as a filler, may be contained other than the photosensitive insulation-property resin. For example, the third insulating layer 65 may contain silica (SiO$_2$) or the like as a filler.

The third insulating layer 65 included in the thin film layer 12 is formed so as to cover the second via 12A. Examples of the photosensitive insulation-property resin used for the third insulating layer 65 included in the thin film layer 12 include a phenolic-based resin, a polyimide-based resin, and the like. The thickness of the third insulating layer 65 may be set to, for example, about 5 to 10 μm. Furthermore, as described above, the thickness of the insulating layer 11 is, for example, about 45 μm to 80 μm, so that the thickness of the insulating layer 11 is considerably thicker than that of the third insulating layer 65 included in the thin film layer 12.

The third conductive layer 16 that is a conductive layer located at the uppermost level included in the thin film layer 12 is formed on one of the sides of the third insulating layer 65 that is the insulating layer located at the uppermost level included in the thin film layer 12. The third conductive layer 16 includes the first pad 16A and the second pad 16B protruding from the via wiring and the upper surface of the insulating layer located at the uppermost level. The thickness of the third conductive layer 16 (including the pad portion protruding from the upper surface of the insulating layer located at the uppermost level) may be set to, for example, about 10 μm. The planer shape of the first pad 16A constituting the third conductive layer 16 may be a round shape with the diameter of, for example, about 20 to 30 μm. The pitch of the first pad 16A constituting the third conductive layer 16 may be set to about, for example, 40 to 50 μm. Furthermore, the first pad 16A constituting the third conductive layer 16 can be used to electrically connect to an electronic component, such as a chip 3.

The planer shape of the second pad 16B constituting the third conductive layer 16 can be a rectangular shape with dimensions of, for example, 0.1 mm by 0.1 mm to 2 mm by 2 mm. The pitch of the second pad 16B constituting the third conductive layer 16 may be set to, for example, about 0.1 mm to 2 mm. Furthermore, the second pad 16B constituting the third conductive layer 16 can be used to electrically connect to the connector 4.

In addition, a surface processing layer (not illustrated) may be formed on the surface (only on the upper surface, or, on both of the upper surface and the side surface) of each of the first pad 16A and the second pad 16B constituting the third conductive layer 16. Examples of the surface processing layer include an Au layer, an Ni/Au layer (a metal layer formed by laminating an Ni layer and an Au layer in this order), an Ni/Pd/Au layer (a metal layer formed by laminating an Ni layer, a Pd layer, and an Au layer in this order), and the like. In addition, a surface processing layer may be formed by performing an anti-oxidation treatment, such as an organic Solderability Preservative (OSP) process, on the surface (only on the upper surface, or, on both of the upper surface and the side surface) of each of the first pad 16A and the second pad 16B constituting the third conductive layer 16.

FIG. 3 is a diagram illustrating one example of each of the dielectric constant and the dielectric loss tangent of each of the insulating layers. The dielectric constant of the insulating layer included in the thin film layer 12, the dielectric constant of the insulating layer 11, and the dielectric constant of the adhesive layer 13 are within a range of 3.2 to 4.6. In contrast, the dielectric loss tangent in the thin film layer 12 is within a range of 0.01 to 0.06, the dielectric loss tangent in the insulating layer 11 is within a range of 0.004 to 0.02, the dielectric loss tangent in the adhesive layer 13 is within a range of 0.004 to 0.02.

FIG. 4 is a diagram illustrating one example of the characteristics of a connector terminal 4A and a chip terminal 3A. The chip terminal 3A connected to the first pad 16A is formed such that the shape thereof is a round shape, the electrode size is within a range of 20 μm to 100 μm in diameter, the thickness of the electrode is within a range of 5 μm to 20 μm, and the electrode pitch is within a range of 30 μm to 200 μm. In contrast, the connector terminal 4A that is connected to the second pad 16B is formed such that the shape thereof is a rectangular shape, the electrode size is within a range of 0.1×0.1 mm to 2×2 mm, the thickness of the electrode is within a range of 5 μm to 20 μm, and the electrode pitch is within a range of 0.1 mm to 2 mm.

The build-up substrate 2 is a multi-layer wiring substrate in which wiring layers and insulating layers are laminated on a core layer that is not illustrated and can be manufactured by using, for example, a widely known build-up technique. Each of the wiring layers included in the build-up substrate 2 is constituted such that the wiring density is lower (the line/space are wider) than that of the wiring layers included in the wiring substrate 5. The line/space of each of the wiring layers included in the build-up substrate 2 may be set to, for example, about 20 μm/20 μm.

The plurality of chips 3 and the connectors 4 are mounted on the wiring substrate 5 as a flip chip mounting. The chips 3 are constituted such that a semiconductor integrated circuit (not illustrated) or the like is formed on a sheeted semiconductor substrate made of, for example, silicon or the like. On the surface on which a circuit used for the semiconductor substrate is formed, a chip terminal 3A that is electrically connected to a semiconductor integrated circuit (not illustrated) is formed. The connectors 4 are connectors that send, as serial transmission, a high-speed signal to and from, for example, the chips 3. The connector terminal 4A is formed at each of the connectors 4.

The chip terminal 3A of the chip 3 is electrically connected, by way of a solder bump 18, to the first pad 16A that is included in the third conductive layer 16 formed on the wiring substrate 5. The material used for the solder bump 18 may be, for example, SnBi solder or the like. Examples of the chip 3 include a memory (a dynamic random access memory (DRAM), etc.), logic (a central processing unit (CPU), etc.) and the like. In addition, on the wiring substrate 5, one or two pieces of the chips 3 may be mounted, or, four or more pieces of the chips 3 may be mounted. The connector terminal 4A of the connector 4 is electrically connected to the second pad 16B included in the third conductive layer 16 formed on the wiring substrate 5 by way of the solder bump 18.

In the semiconductor device 1, the chips 3 are mounted on the wiring substrate 5 including the thin film layer 12 having a high wiring density, so that it is possible to easily perform a signal connection between the chips 3 by using the wiring pattern that has a high wiring density.

Method of Manufacturing Wiring Substrate 5 According to the First Embodiment

In the following, a method of manufacturing the wiring substrate 5 according to the first embodiment will be described. FIG. 5A to FIG. 8 are diagrams each illustrating a manufacturing step of the wiring substrate 5 according to the first embodiment. Furthermore, here, an example of a step of manufacturing a single piece of the wiring substrate 5 is indicated; however, it may be possible to use a step of manufacturing a plurality of parts constituting the wiring substrate 5 and then dicing the wiring substrate 5 to form each of the wiring substrates 5.

Figure 5A:
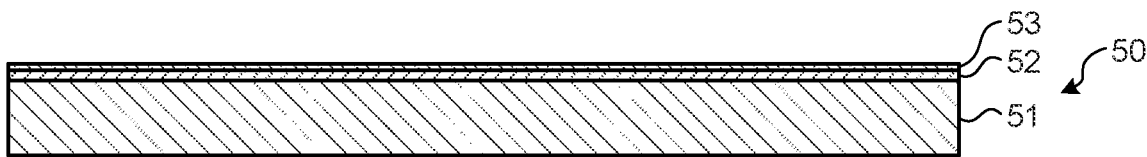
FIG. 5A is a diagram illustrating one example of a preparation step.

FIG. 5A is a diagram illustrating one example of a preparation step. At the preparation step illustrated in FIG. 5A, a support carrier 50 is prepared. The support carrier 50 has a structure in which, for example, a prepreg 52 and a copper foil with carrier 53 are sequentially laminated on a core substrate 51 on which a copper foil is formed. The core substrate 51 is a glass epoxy substrate with the thickness of, for example, about 0.7 mm, and the thickness of the copper foil may be, for example, about 7 to 50 μm. The prepreg 52 is obtained such that, for example, a thermosetting epoxy-based resin, a polyimide-based resin, or the like is impregnated in a woven fabric or a non-woven fabric made of a glass fiber, an aramid fiber, or the like. The copper foil with carrier 53 has a structure in which a thin foil that is made of, for example, copper with a thickness of about 1.5 to 5 μm is pasted, by way of a release layer (not illustrated), onto a thick foil (carrier foil) that is made of, for example, copper with a thickness of about 10 to 50 so as to be capable of being stripped off.

In addition, the structure of the support carrier 50 is one example and is not limited to this. For example, in the support carrier 50, instead of the core substrate 51, laminated structure in which a plurality of prepregs are laminated may be used. In addition, the support carrier 50 may have a structure in which the copper foil with carrier 53 is arranged on both sides of a glass substrate, a metal substrate, or the like by way of a release layer.

Figure 5B:
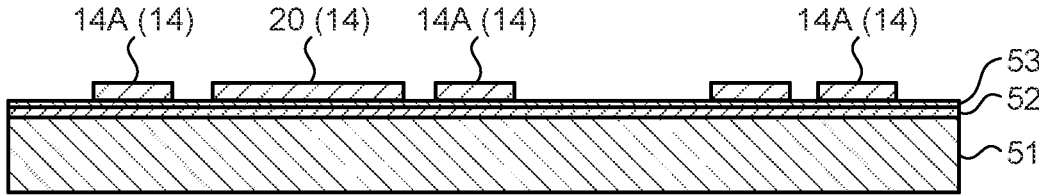
FIG. 5B is a diagram illustrating one example of a conductor layer forming step.

FIG. 5B is a diagram illustrating one example of a conductor layer forming step. At the step illustrated in FIG. 5B, a photosensitive resist layer (not illustrated) is formed on the entirety of the upper surface (an upper surface of the thin foil) of the copper foil with carrier 53 disposed on the upper side, and exposure and development are performed on a resist layer, so that an opening portion from which a portion that forms the first conductive layer 14 is exposed is formed. As the resist layer, for example, a dry film resist may be used. Then, by using the electrolytic plating method in which the copper foil with carrier 53 that is disposed on the upper side is used as a power supply layer, the first conductive layer 14 that is an electrolytic plating layer is formed on the upper surface of the copper foil with carrier 53 that is exposed inside the opening portion. The material and the thickness of the first conductive layer 14 are as described above. Then, the resist layer is stripped. The first conductive layer 14 includes the pad 14A and a transmission wiring 20.

Figure 5C:
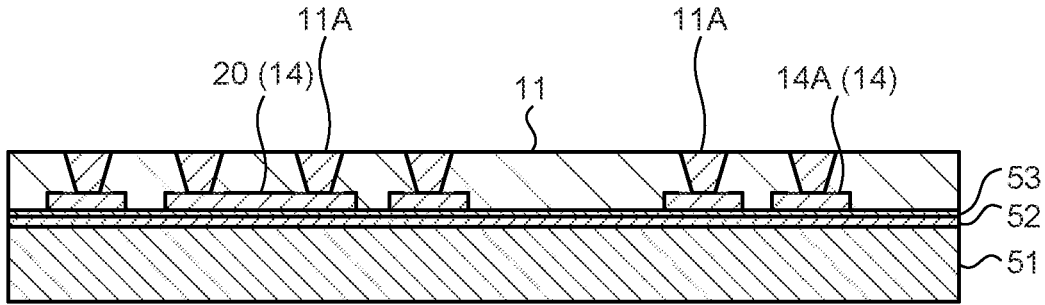
FIG. 5C is a diagram illustrating one example of an insulating layer forming step.

FIG. 5C is a diagram illustrating one example of an insulating layer forming step. At the step illustrated in FIG. 5C, the insulating layer 11, which covers both of the copper foil with carrier 53 that is disposed on the upper side and the first conductive layer 14, is formed on the upper surface of the prepreg 52 that is disposed on the upper side.

Specifically, for example, a film insulation-property resin in a semi cured state made of a non-photosensitive thermosetting resin as a main component is prepared. Then, the insulation-property resin is laminated on the upper surface of the prepreg 52 that is disposed on the upper side so as to cover both of the copper foil with carrier 53 and the first conductive layer 14, and the insulating layer 11 is formed by hardening the insulation-property resin by heating and pressurizing the insulation-property resin. A multi-layer film that is in the semi cured state is laminated on the upper surface of the prepreg 52 that is disposed on the upper side so as to cover the copper foil with carrier 53 and the first conductive layer 14, and obtains an insulating layer by hardening the multi-layer film by heating and pressurizing the multi-layer film.

Then, a via hole that passes through the front and back sides of the insulating layer 11 that allows the upper surface of the first conductive layer 14 to be exposed is formed in the insulating layer 11. The via hole can be formed by using a laser processing method that uses, for example, a $CO_2$ laser, a YAG laser, an excimer laser, or the like. After the via hole has been formed, it is preferable to perform a desmear process, and remove a resin residue adhered to the surface of each of the first conductive layers 14 that are exposed from the bottom of the via hole.

Then, at the subsequent step, the first via 11A is formed in the insulating layer 11. The first via 11A is able to be formed by using, for example, the semi-additive method. Specifically, first, by using an electroless plating method or a sputtering method, a seed layer is formed on the surface of the first conductive layer 14 that is exposed at the surface of the insulating layer 11 including the inner wall of the via hole and is exposed inside the via hole. It is possible to use a copper layer with a thickness of, for example, about 100 to 350 nm as the seed layer. It may also be possible to use, as the seed layer, a laminated film obtained by laminating a titanium layer with a thickness of about 20 to 50 nm and a copper layer with a thickness of about 100 to 300 nm in this order. By forming the titanium layer at a lower layer of the seed layer, it is possible to improve adhesion between the insulating layer 11 and the first via 11A. Instead of using titanium, titanium nitride or the like may be used. In addition, titanium and titanium nitride are metals having a corrosion resistance property that is higher than that of copper.

Then, a resist layer having photosensitivity is formed on the entirety of the upper surface of the seed layer, and exposure and development are performed on the resist layer, so that an opening portion from which a portion that forms the first via 11A is exposed is formed. As the resist layer, for example, a dry film resist may be used. Then, by using the electrolytic plating method in which the seed layer is used as the power supply layer, an electrolytic plating layer (for example, a copper layer) is formed on the upper surface of the seed layer that is exposed inside the opening portion.

Then, after the resist layer has been stripped, the electrolytic plating layer is used as a masking layer, the portion of the seed layer that is not covered by the electrolytic plating layer is removed by etching. As a result, the first via 11A in which electrolytic plating layer is laminated on the seed layer is formed. Up to the steps as described above, a layer structure in which the insulating layer 11 and the first conductive layer 14 are arranged with respect to the support carrier 50 as a center.

Then, at the step, the upper surface side of the first via 11A is polished in order to expose the upper surface of the insulating layer 11 and the upper surface of the first via 11A that fills the via hole, so that the first via 11A filled inside the via hole is formed. To polish the first via 11A, for example, a chemical mechanical polishing process (CMP process), or the like may be used. The upper surface of the first via 11A can be, for example, flush with the upper surface of the insulating layer 11.

When the first via 11A is polished, a part of the upper surface of the insulating layer 11 may also be polished at the same time. By removing a part of the upper surface of the insulating layer 11 by polishing the upper surface of the insulating layer 11 together with the first via 11A, it is possible to reduce the degree of roughness of the upper surface of the insulating layer 11 before the insulating layer 11 is polished. In other words, it is possible to improve the smoothness of the upper surface of the insulating layer 11. The degree of roughness of the upper surface of the insulating layer 11 before the CMP process is performed (before polishing) may be Ra of, for example, about 300 to 400 nm, and is reduced to about Ra of 15 to 40 nm as a result of performing the CMP process. In this way, by improving smoothness by reducing the degree of roughness of the upper surface of the insulating layer 11, it is possible to form micro wiring (a wiring layer with high wiring density) at the subsequent step. In addition, the degree of roughness of the lower surface of the insulating layer 11 is, for example, about Ra of 180 to 280 nm.

At the subsequent step, the second conductive layer 15 is formed on the insulating layer 11. A photosensitive resist layer (not illustrated) is formed on the entirety of the upper surface of the first via 11A, exposure and development are performed on the resist layer, so that an opening portion from which a portion that forms the second conductive layer 15 is exposed is formed. As a resist layer, for example, a dry film resist can be used. Then, by using the electrolytic plating method in which the first via 11A is used as the power supply layer, the second conductive layer 15 that is an electrolytic plating layer is formed on the upper surface of the first via 11A that is exposed inside the opening portion. The material and the thickness of the second conductive layer 15 are as described above. Then, the resist layer is stripped. The second conductive layer 15 includes the pad 15A.

Figure 6A:
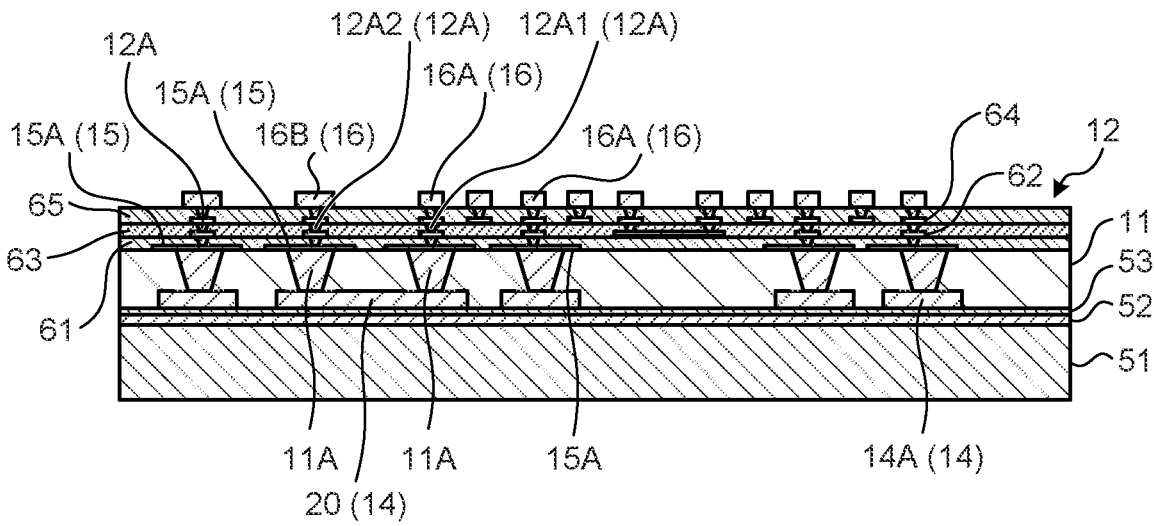
FIG. 6A is a diagram illustrating one example of a thin film layer forming step.

FIG. 6A is a diagram illustrating one example of a thin film layer forming step. At the step illustrated in FIG. 6A, the thin film layer 12 is formed on each of the insulating layer 11 and the second conductive layer 15. The thin film layer 12 forms a high-density wiring layer by using, for example, the semi-additive method.

Then, as a result of repeating the same steps, the first insulating layer 61, the first wiring layer 62, the second insulating layer 63, the second wiring layer 64, and the third insulating layer 65 that are included in the thin film layer 12 are formed, and the third conductive layer 16 is formed on the third insulating layer 65 that is located at the uppermost of the thin film layer 12. The surface processing layer that has been described above is formed on the surface (only the upper surface, or, both of the upper surface and the side surfaces) of the pad that constitutes the third conductive layer 16. The third conductive layer 16 includes the first pad 16A and the second pad 16B.

Then, at the step, an outer peripheral portion of the structure is cut by using a dicing blade or the like. The cutting process is performed so as to remove an area in which the insulating layer 11 is in direct contact with the prepreg 52 disposed on the upper side. Consequently, it is possible to easily strip a portion in which the thick foil is in contact with the thin foil included in the copper foil with carrier 53. In other words, it is possible to easily remove the main part of the support carrier 50.

Figure 6B:
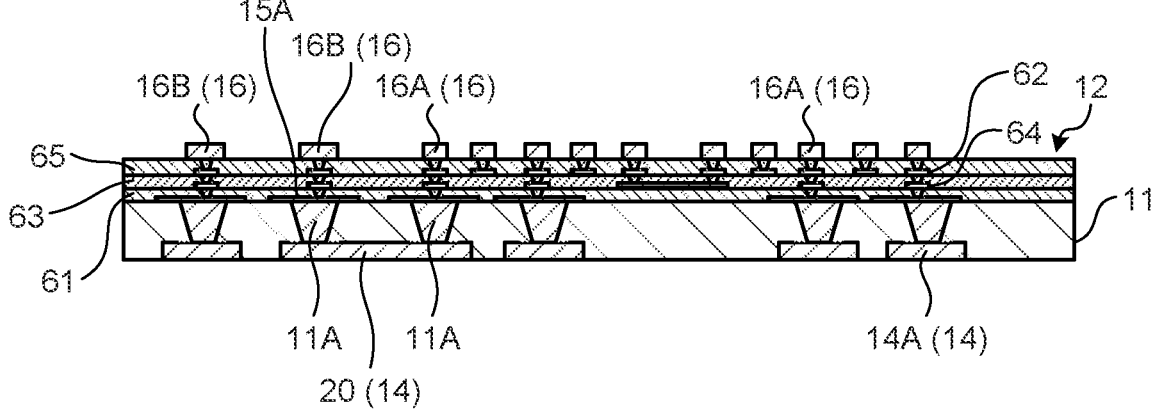
FIG. 6B is a diagram illustrating one example of a support carrier stripping step.

FIG. 6B is a diagram illustrating one example of a support carrier stripping step. At the step illustrated in FIG. 6B, the thin foil is removed from the structure in which the main part of the support carrier 50 has been removed. It is possible to remove the thin foil included in the copper foil with carrier 53 by performing, for example, wet etching. Consequently, a lower surface of the first conductive layer 14 is exposed at the lower surface of the insulating layer 11. The lower surface of the insulating layer 11 and the lower surface of the first conductive layer 14 can be, for example, flush with each other. In other words, the transmission wiring 20 included in the first conductive layer 14 is exposed at the lower surface of the insulating layer 11.

Figure 7:
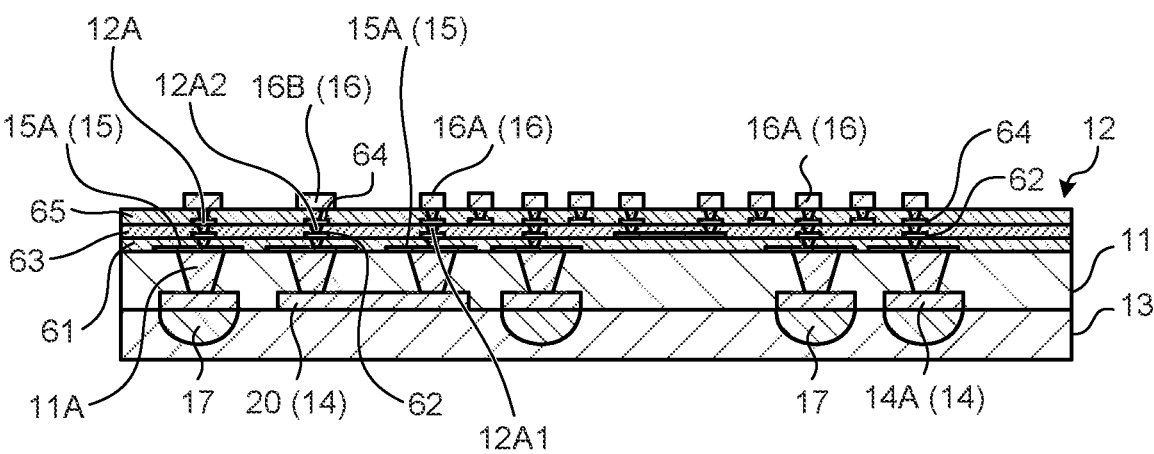
FIG. 7 is a diagram illustrating one example of a solder forming step.

FIG. 7 is a diagram illustrating one example of a solder forming step. At the step illustrated in FIG. 7, the solder layer 17 is formed on the lower surface of the first conductive layer 14 by performing a screen printing process or the like. The material and the thickness of the solder layer 17 are as described above. Then, the adhesive layer 13 that covers the solder layer 17 is formed on the lower surface of the insulating layer 11. The adhesive layer 13 can be formed by laminating a thermosetting resin film that has an insulation property and that is referred to as a Non Conductive Film (NCF) on, for example, the lower surface of the insulating layer 11 such that the thermosetting resin film covers the solder layer 17, and heating and hardening the adhesive layer 13. By performing the steps described above, the wiring substrate 5 has been completed. In addition, the solder layer 17 and the adhesive layer 13 are not component elements essential for the wiring substrate 5, and may be formed when needed (for example, immediately before the wiring substrate 5 is mounted on the build-up substrate 2).

As a result, the wiring substrate 5 including the first conductive layer 14, the insulating layer 11, the second conductive layer 15, the thin film layer 12, and the third conductive layer 16 has been completed.

Figure 8:
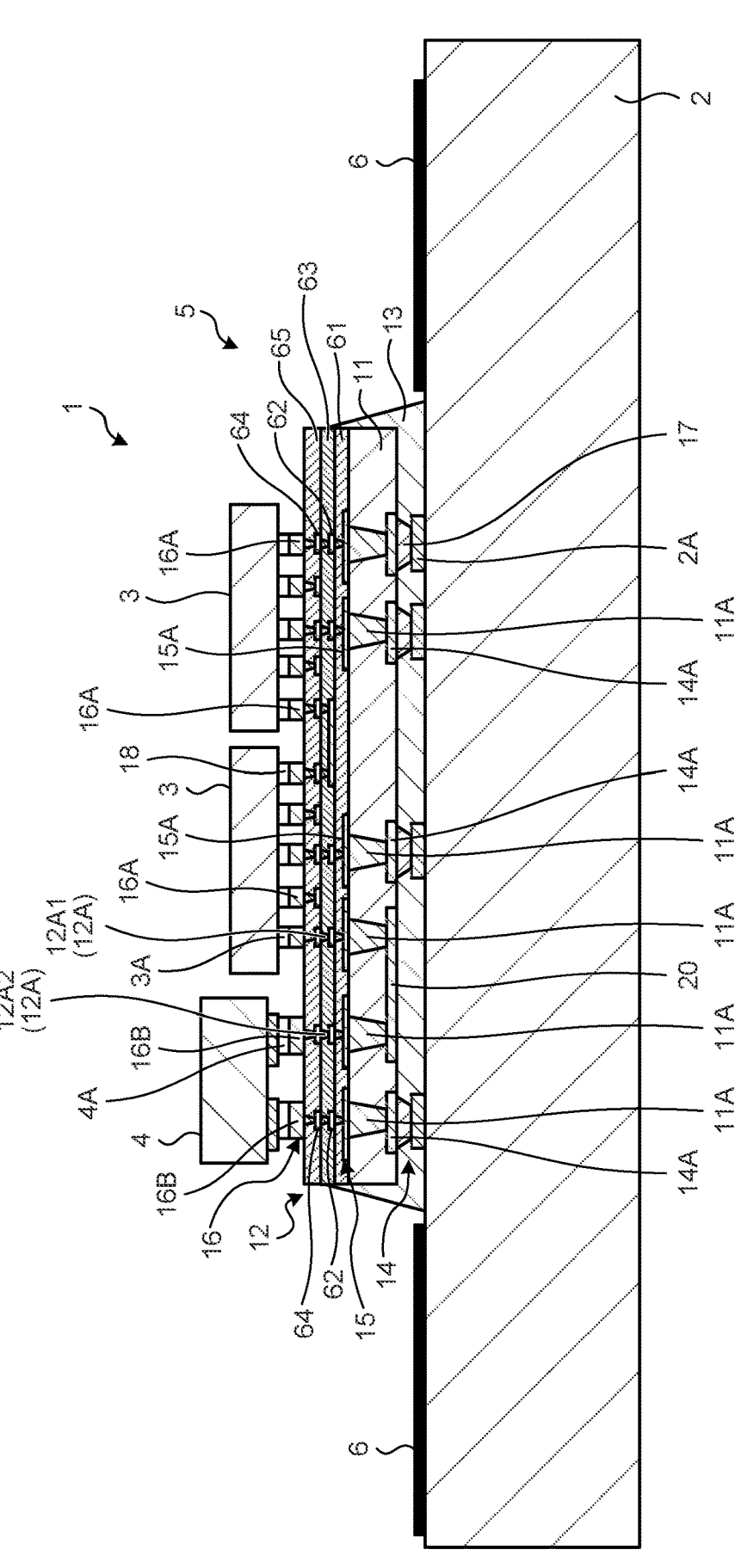
FIG. 8 is a diagram illustrating one example of a wiring substrate mounting step.

FIG. 8 is a diagram illustrating one example of a wiring substrate mounting step. The plurality of pieces of the chips 3 and the connector 4 are mounted on the wiring substrate 5 as a flip chip mounting. The chip terminal 3A of the chip 3 is electrically connected to the first pad 16A included in the third conductive layer 16 included in the wiring substrate 5 by way of the solder bump 18. The connector terminal 4A of the connector 4 is electrically connected to the second pad 16B included in the third conductive layer 16 included in the wiring substrate 5 by way of the solder bump 18. The semiconductor device 1 is formed by electrically connecting, by way of the solder layer 17, the pad 14A included in the first conductive layer 14 in the wiring substrate 5 and a pad 2A disposed on the build-up substrate 2.

The wiring substrate 5 according to the first embodiment has been constituted such that, in the insulating layer 11 that is thicker than the insulating layer included in the thin film layer 12, the transmission wiring 20 that electrically connects between the via that is connected to the first pad 16A and the via that is connected to the second pad 16B is arranged. The thickness of the insulating layer 11 is thicker than the thickness of the insulating layer included in the thin film layer 12, so that it is possible to thicken the transmission wiring 20. As a result, it is possible to reduce the wiring resistance of the transmission wiring 20, so that it is possible to suppress an insertion loss and a reflection loss occurring when a high-speed signal passes through the transmission wiring 20 and it is thus possible to improve the transmission characteristic of the high-speed signal.

The wiring substrate 5 has been constituted such that the transmission wiring 20 is arranged in the first conductive layer 14 that is located on the surface of the insulating layer 11, at the side opposite to the surface that is in contact with the thin film layer 12. The transmission wiring 20 is embedded in the insulating layer 11 so as to be in contact with the adhesive layer 13. Then, the dielectric loss tangent of the insulating layer 11 that includes the transmission wiring 20 is smaller than the dielectric loss tangent of the thin film layer 12. As a result, it is possible to suppress the insertion loss and the reflection loss occurring when a high-speed signal passes through the transmission wiring 20 by the dielectric loss tangent, and it is thus possible to improve the transmission characteristic of the high-speed signal.

The wiring substrate 5 transmits a high-speed serial signal between the chips 3 and the connectors 4 by way of the transmission wiring 20. Consequently, it is possible to suppress the insertion loss and the reflection loss occurring when the high-speed signal passes.

The transmission wiring 20 is formed by using the same step as that used for the pad 14A at the time at which the first conductive layer 14 is formed. Consequently, it is possible to easily form the transmission wiring 20.

In addition, for convenience of description, a case has been described as an example in which the transmission wiring 20 transmits a signal between the chips 3 and the connectors 4 that are mounted on the wiring substrate 5; however, the transmission wiring 20 may transmit a signal between, for example, the chips 3, and between, for example, the connectors 4, and appropriate modifications are possible.

In addition, a case has been described as an example in which, in the wiring substrate 5 according to the first embodiment, the transmission wiring 20 is arranged in the first conductive layer 14; however, the example is not limited to this, and, for example, the transmission wiring 20 may be arranged in the second conductive layer 15. An embodiment thereof will be described below as a second embodiment.

Second Embodiment

Figure 9:
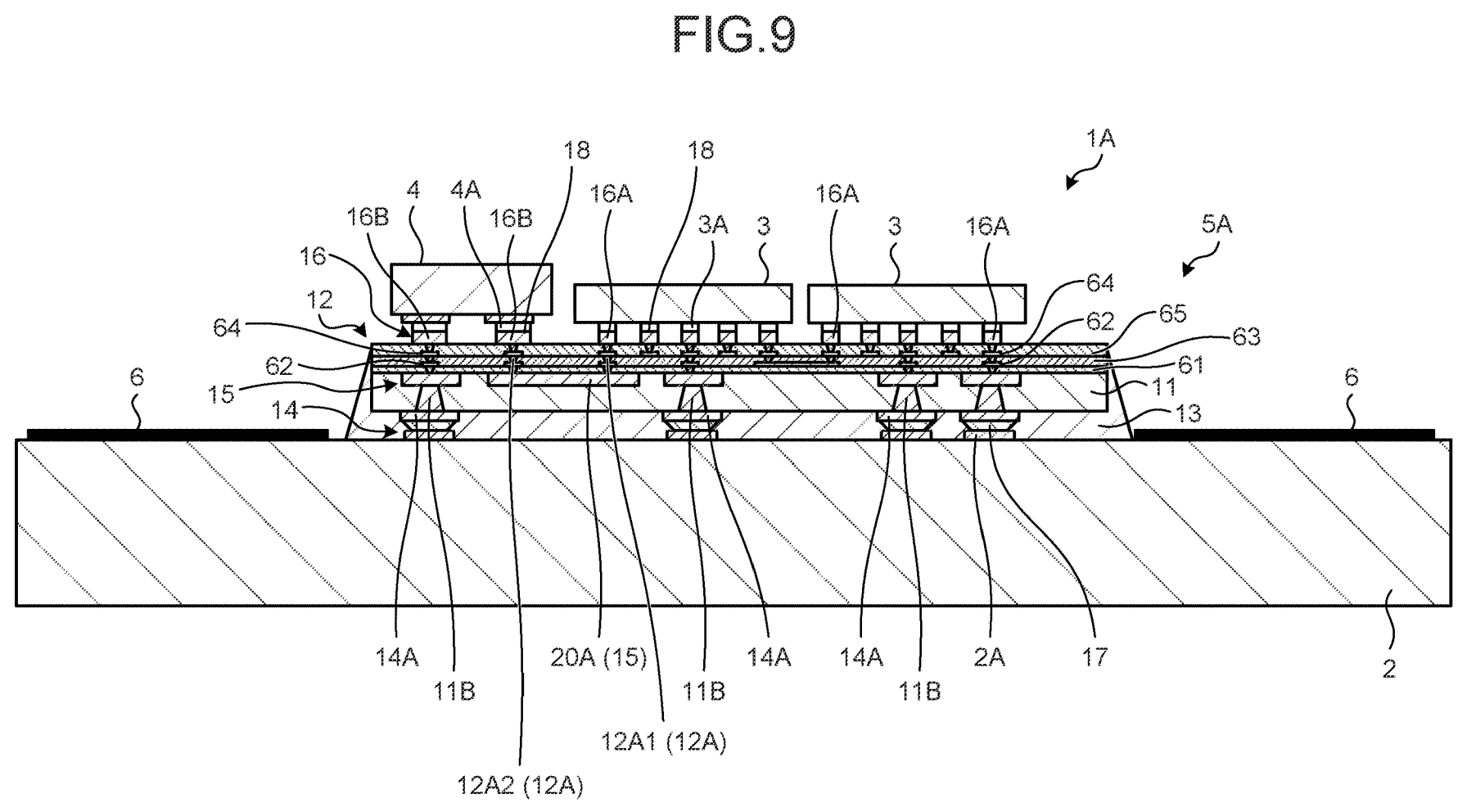
Figure 10:
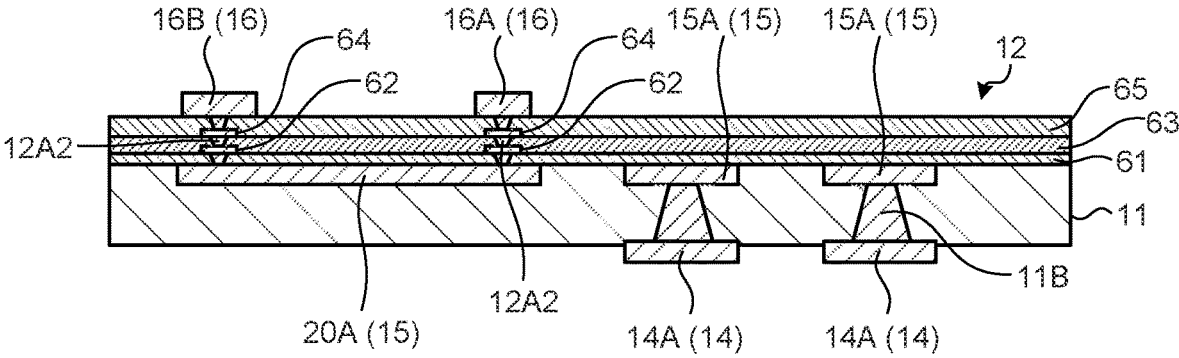
FIG. 10 is a schematic cross-sectional diagram illustrating one example of a wiring substrate.

FIG. 9 is a diagram illustrating one example of a semiconductor device 1A according to the second embodiment, and FIG. 10 is a schematic cross-sectional diagram illustrating one example of a wiring substrate 5A. Furthermore, by assigning the same reference numerals to components having the same configuration as those in the semiconductor device 1 according to the first embodiment, overlapped descriptions of the configuration and the operation thereof will be omitted. The wiring substrate 5A illustrated in FIG. 10 is different from the wiring substrate 5A illustrated in FIG. 2 in that a transmission wiring 20A is arranged in the second conductive layer 15 instead of arranging the transmission wiring 20 in the first conductive layer 14.

The wiring substrate 5A includes the insulating layer 11, the thin film layer 12, and the adhesive layer 13. The insulating layer 11 includes the first conductive layer 14, the second conductive layer 15, and a first via 11B. As described above, the thickness of the insulating layer 11 is, for example, about 45 μm to 80 μm. As described above, the thickness of each of the first insulating layer 61, the second insulating layer 63, and the third insulating layer 65 included in the thin film layer 12 is, for example, about 5 to 10 μm.

The first conductive layer 14 includes the pad 14A that is in contact with the pad 2A included in the build-up substrate 2. The first conductive layer 14 is a conductive layer located at the lowermost layer and is covered by the insulating layer 11. The second conductive layer 15 includes the transmission wiring 20A, in addition to the pad 15A that electrically connects between the first via 11B included in the insulating layer 11 and the second via 12A included in the thin film layer 12. The thickness of the second conductive layer 15 is, for example, about 10 to 20 μm.

The first via 11B is via wiring that is embedded in the insulating layer 11. In more detail, the first via 11B is the via wiring that is filled inside the via hole by passing through the insulating layer 11 and exposing the upper surface of the first conductive layer 14, and is electrically connected to the first conductive layer 14. The via hole can be a recess portion that has a truncated cone shape and in which the diameter of the opening portion that is opened on the thin film layer 12 side is smaller than the diameter of the bottom surface of the opening portion that is formed by the upper surface of the first conductive layer 14. The diameter of the opening portion of the via hole may be set to, for example, about 60 to 70 μm.

The upper surface of the first via 11B is exposed from the upper surface of the insulating layer 11. The upper surface of the first via 11B can be, for example, flush with the upper surface of the insulating layer 11. The upper surface of the first via 11B is directly bonded to the lower surface of the thin film layer 12. In addition, the lower surface of the first via 11B is directly bonded to the first conductive layer 14 inside the insulating layer 11. The material of the first via 11B is the same material as that is used for, for example, the first conductive layer 14.

The first via 11B is constituted from only the via wiring that is formed in the via hole in the insulating layer 11. In other words, a wiring pattern that is integrally formed on the upper surface of the insulating layer 11 is not provided in the first via 11B. The first via 11B and the thin film layer 12 are electrically connected, but are not formed in an integrated manner. Specifically, in a manufacturing method that will be described later, the thin film layer 12 is constituted by sequentially laminating the wiring layers and the insulating layers. The wiring layer included in the thin film layer 12 is a high-density wiring pattern (for example, the line/space are about 3 μm/3 μm) formed by using the semi-additive method. The thin film layer 12 includes the thin film wiring layer, the third conductive layer 16, and the second via 12A.

The thin film wiring layer includes the first insulating layer 61, the first wiring layer 62 that is provided on the first insulating layer 61, the second insulating layer 63 that covers the first wiring layer 62 and that is laminated on the first insulating layer 61, the second wiring layer 64 that is provided on the second insulating layer 63, and the third insulating layer 65 that covers the second wiring layer 64 and that is laminated on the second insulating layer 63. Furthermore, the thickness of each of the first wiring layer 62 and the second wiring layer 64 included in the thin film wiring layer may be set to, for example, about 1 to 3 μm. In the above, as an example, the thin film wiring layer has the 5-layered structure constituted of the first insulating layer 61, the first wiring layer 62, the second insulating layer 63, the second wiring layer 64, and the third insulating layer 65; however, the structure is not limited to the 5-layered structure, and appropriate modifications are possible.

The transmission wiring 20A included in the second conductive layer 15 is arranged in the insulating layer 11 located at a boundary portion disposed between the insulating layer 11 and the thin film layer 12. The wiring thickness of the second conductive layer 15 is thicker than that of the first wiring layer 62 or the second wiring layer 64 included in the thin film wiring layer. The transmission wiring 20A electrically connects between the first via 11B that is electrically connected to the first via 12A1 (12A) that is connected to the first pad 16A, and the first via 11B that is electrically connected to the second via 12A2 (12A) that is connected to the second pad 16B. In other words, the transmission wiring 20A is a serial transmission path that electrically connects between the chip 3 that is connected to the first pad 16A and the connector 4 that is connected to the second pad 16B, and that transmits, for example, a high-speed serial signal.

Method of Manufacturing Wiring Substrate According to the Second Embodiment

In the following, a method of manufacturing the wiring substrate 5A according to the second embodiment will be described. FIG. 11A to FIG. 15 are diagrams each illustrating a manufacturing step of the wiring substrate 5A according to the second embodiment. Furthermore, here, an example of a step of manufacturing a single piece of the wiring substrate 5A is indicated; however, it may be possible to use a step of manufacturing a plurality of parts constituting the wiring substrate 5A and then dicing the wiring substrate 5 to form each of the wiring substrates 5A.

Figure 11A:
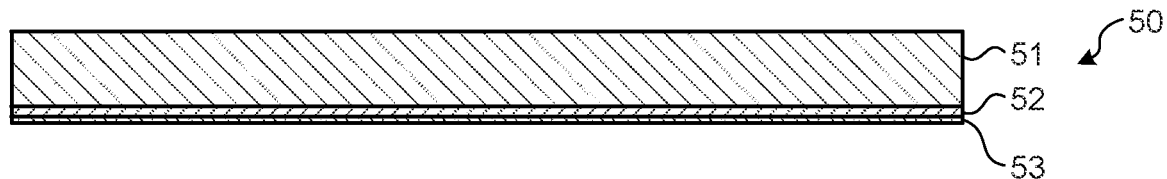
FIG. 11A is a diagram illustrating one example of a preparation step.

FIG. 11A is a diagram illustrating one example of a preparation step. At the preparation step illustrated in FIG.

11A, the support carrier 50 is prepared. The support carrier 50 has a structure in which, for example, the prepreg 52 and the copper foil with carrier 53 are sequentially laminated on the core substrate 51 on which a copper foil is formed.

Figure 11B:
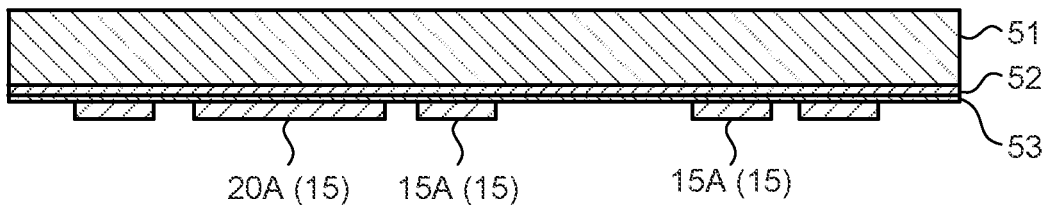
FIG. 11B is a diagram illustrating one example of a conductor layer forming step.

FIG. 11B is a diagram illustrating one example of a conductor layer forming step. Then, at the step illustrated in FIG. 11B, a photosensitive resist layer (not illustrated) is formed on the entirety of the upper surface (upper surface of the thin foil) of the copper foil with carrier 53 disposed on the upper side, and exposure and development are performed on the resist layer, so that an opening portion from which a portion that forms the second conductive layer 15 is exposed is formed. As the resist layer, for example, a dry film resist may be used. Then, by using the electrolytic plating method in which the copper foil with carrier 53 that is disposed on the upper side is used as the power supply layer, the second conductive layer 15 that is an electrolytic plating layer is formed on the upper surface of the copper foil with carrier 53 that is exposed inside the opening portion. The material and the thickness of the second conductive layer 15 are as described above. Then, the resist layer is stripped. The second conductive layer 15 includes the pad 15A and the transmission wiring 20A.

Figure 11C:
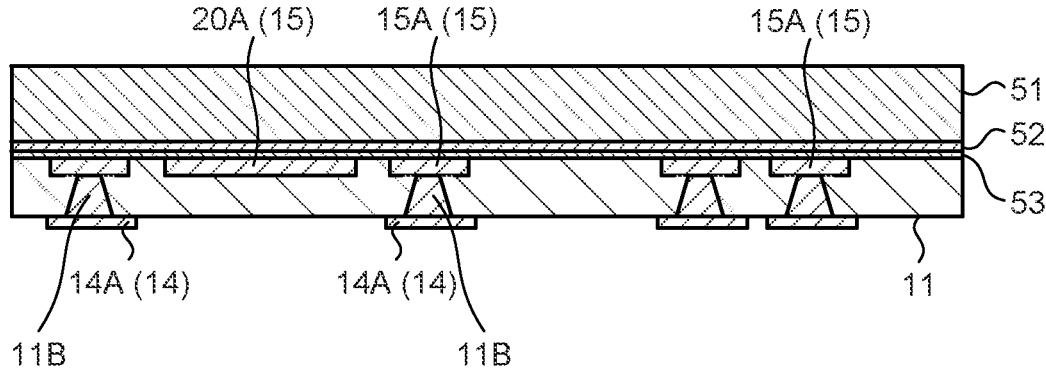
FIG. 11C is a diagram illustrating one example of an insulating layer forming step.

FIG. 11C is a diagram illustrating one example an insulating layer forming step. At the step illustrated in FIG. 11C, the insulating layer 11, which covers the copper foil with carrier 53 disposed on the upper side and the second conductive layer 15, is formed on the upper surface of the prepreg 52 that is disposed on the upper side.

Specifically, for example, a film insulation-property resin in a semi cured state made of a non-photosensitive thermosetting resin as a main component is prepared. Then, the insulation-property resin is laminated on the upper surface of the prepreg 52 disposed on the upper side so as to cover the copper foil with carrier 53 and the second conductive layer 15, and the insulating layer 11 is formed by hardening the insulation-property resin by heating and pressurizing the insulation-property resin. A multi-layer film that is in the semi cured state is laminated on the upper surface of the prepreg 52 that is disposed on the upper side so as to cover the copper foil with carrier 53 and the second conductive layer 15, and obtains the insulating layer 11 by hardening the multi-layer film by heating and pressurizing the multi-layer film.

Then, a via hole that passes through the front and back sides of the insulating layer 11 that allows the lower surface of the second conductive layer 15 to be exposed is formed in the insulating layer 11. The via hole can be formed by using a laser processing method that uses, for example, a $CO_2$ laser, a YAG laser, an excimer laser, or the like. After the via hole has been formed, it is preferable to perform a desmear process, and remove a resin residue adhered to the surface of each of the second conductive layers 15 that are exposed from the bottom of the via hole.

Then, at the subsequent step, the first via 11B is formed in the insulating layer 11. The first via 11B is able to be formed by using, for example, the semi-additive method. Specifically, first, a seed layer is formed on the surface of the second conductive layer 15 that is exposed at the surface of the insulating layer 11 including the inner wall of the via hole and is exposed inside the via hole. It is possible to use a copper layer with a thickness of, for example, about 100 to 350 nm as the seed layer. It may also be possible to use, as the seed layer, a laminated film obtained by laminating a titanium layer with a thickness of about 20 to 50 nm and a copper layer with a thickness of about 100 to 300 nm in this order. By forming the titanium layer at a lower layer of the seed layer, it is possible to improve adhesion between the insulating layer 11 and the first via 11B. Instead of using titanium, titanium nitride or the like may be used. In addition, titanium and titanium nitride are metals having a corrosion resistance property that is higher that of copper.

Then, a resist layer having photosensitivity is formed on the entirety of the upper surface of the seed layer, and exposure and development are performed on the resist layer, so that an opening portion from which a portion that forms the first via 11B is exposed is formed. As the resist layer, for example, a dry film resist may be used. Then, by using the electrolytic plating method in which the seed layer is used as the power supply layer, an electrolytic plating layer (for example, a copper layer) is formed on the upper surface of the seed layer that is exposed inside the opening portion.

Then, after the resist layer has been stripped, the electrolytic plating layer is used as a masking layer, the portion of the seed layer that is not covered by the electrolytic plating layer is removed by etching. As a result, the first via 11B in which electrolytic plating layer is laminated on the seed layer is formed. Up to the steps as described above, a layer structure in which the insulating layer 11 and the second conductive layer 15 are arranged with respect to the support carrier 50 as a center.

Then, at the step, the lower surface side of the first via 11B is polished in order to expose the lower surface of the insulating layer 11 and the lower surface of the first via 11B that fills the via hole, so that the first via 11B filled inside via hole is formed.

At the subsequent step, the first conductive layer 14 is formed below the insulating layer 11. A photosensitive resist layer (not illustrated) is formed on the entirety of the lower surface of the first via 11B, exposure and development are performed on the resist layer, so that an opening portion for exposing a portion that forms the first conductive layer 14 is formed. As a resist layer, for example, a dry film resist can be used. Then, by using the electrolytic plating method in which the first via 11B is used as the power supply layer, the first conductive layer 14 that is an electrolytic plating layer is formed on the lower surface of the first via 11B that is exposed inside the opening portion. The material and the thickness of the first conductive layer 14 are as described above. Then, the resist layer is stripped. The first conductive layer 14 includes the pad 14A.

Figure 12A:
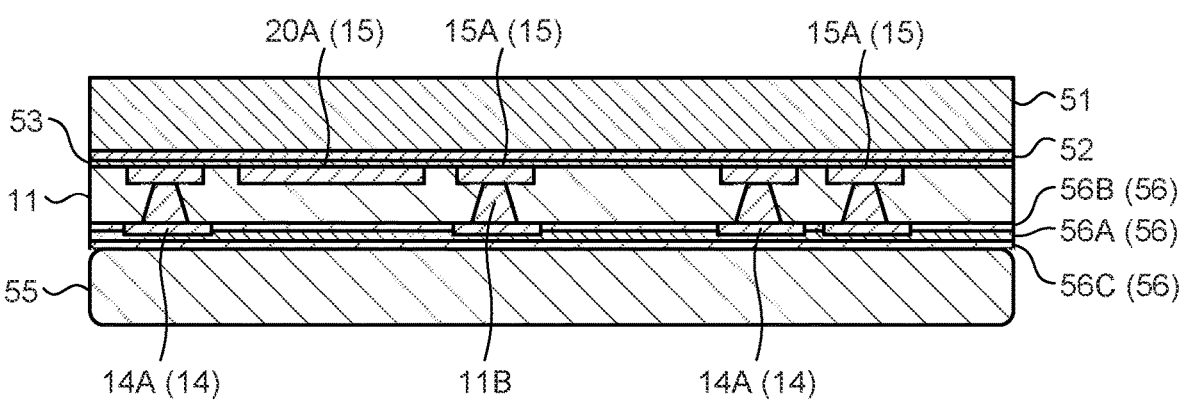
FIG. 12A is a diagram illustrating one example of an inversion support carrier forming step.

FIG. 12A is a diagram illustrating one example of an inversion support carrier forming step. At the step illustrated in FIG. 12A, a stripping sheet 56 with a double-sided sticking type is bonded to the lower surface of each of the first conductive layer 14 and the insulating layer 11. The stripping sheet 56 includes, for example, a polyimide-based base film layer 56A and sticking layers 56B and 56C that are made of an acrylic sticking agent and that are laminated on the front and back sides of the base film layer. Furthermore, the stripping sheet 56 is a sheet with, for example, a thermal release type, an UV release type, or the like. Furthermore, at the step, an inversion support carrier 55 is adhered to the lower surface of the stripping sheet 56. The inversion support carrier 55 is a substrate made of, for example, glass, a metal, or the like.

Figure 12B:
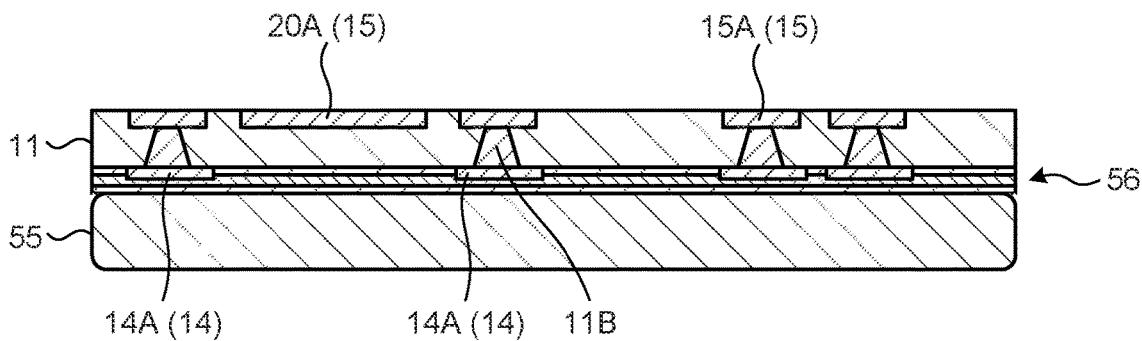
FIG. 12B is a diagram illustrating one example of a support carrier stripping step.

FIG. 12B is a diagram illustrating one example of a support carrier stripping step. At the step illustrated in FIG. 12B, an outer peripheral portion of the structure is cut by using a dicing blade, or the like. The cutting process is performed so as to remove an area in which the insulating layer 11 is in direct contact with the prepreg 52 disposed on the upper side. Consequently, it is possible to easily strip a portion in which the thick foil is in contact with thin foil included in the copper foil with carrier 53. In other words, it is possible to easily remove the main part of the support carrier 50. The thin foil is removed from the structure in which the main part of the support carrier 50 has been removed. The thin foil included in the copper foil with carrier 53 can be removed by performing, for example, wet etching. Consequently, the upper surface of the second conductive layer 15 is exposed at the upper surface of the insulating layer 11. The upper surface of the insulating layer 11 and the upper surface of the second conductive layer 15 can be, for example, flush with each other. In other words, the transmission wiring 20A is exposed at the upper surface of the insulating layer 11.

Figure 13A:
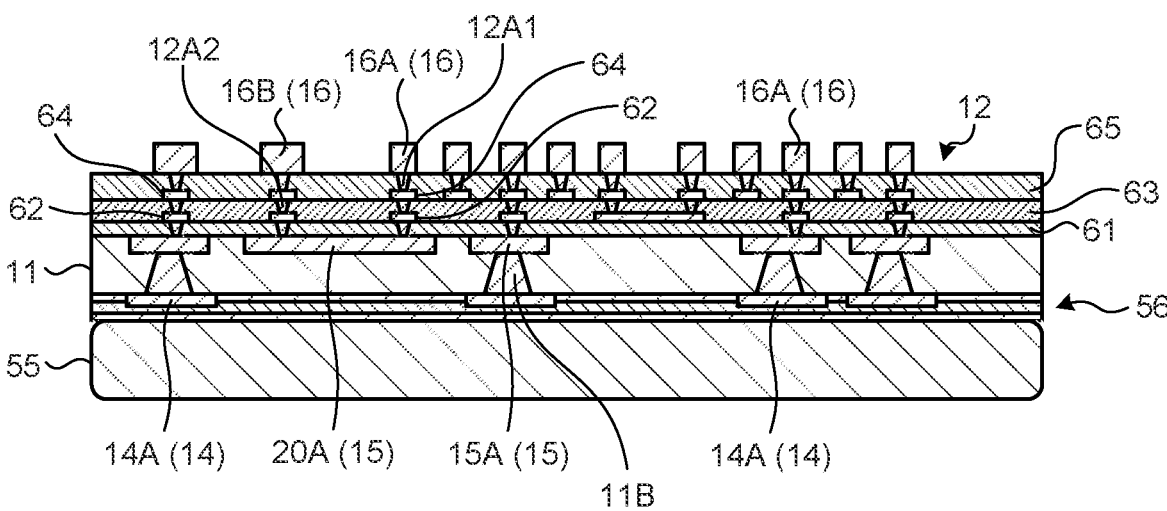
FIG. 13A is a diagram illustrating one example of a thin film layer forming step.

FIG. 13A is a diagram illustrating one example of a thin film layer forming step. At the step illustrated in FIG. 13A, the thin film layer 12 is formed on each of the insulating layer 11 and the second conductive layer 15. The thin film layer 12 forms a high-density wiring layer by using, for example, the semi-additive method.

Then, as a result of repeating the same steps, the first insulating layer 61, the first wiring layer 62, the second insulating layer 63, the second wiring layer 64, and the third insulating layer 65 that are included in the thin film layer 12 are formed, and the third conductive layer 16 is formed on the third insulating layer 65 that is located at the uppermost of the thin film layer 12. The surface processing layer that has been described above is formed on the surface (only the upper surface, or, both of the upper surface and the side surfaces) of the first pad 16A and the second pad 16B that constitute the third conductive layer 16. The third conductive layer 16 includes the first pad 16A and the second pad 16B.

Figure 13B:
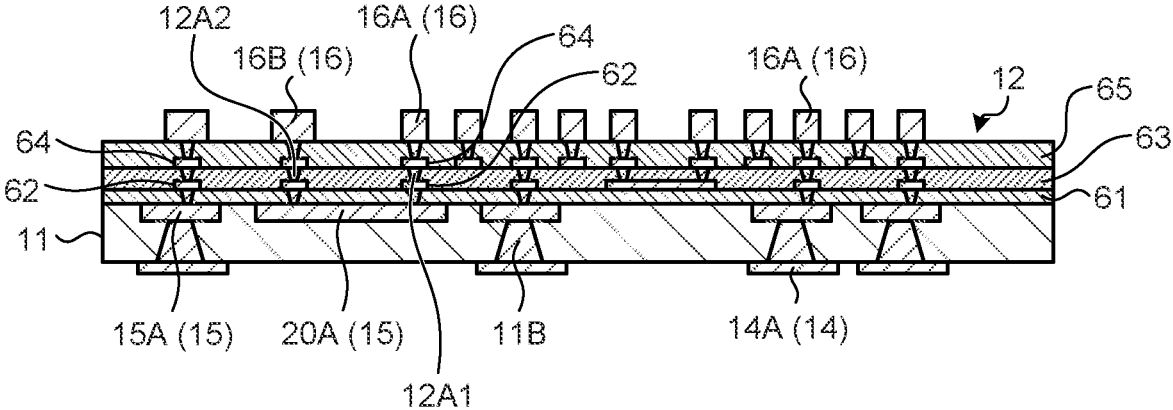
FIG. 13B is a diagram illustrating one example of an inversion support carrier stripping step.

FIG. 13B is a diagram illustrating one example of an inversion support carrier stripping step. At the step illustrated in FIG. 13B, by stripping the stripping sheet 56 adhered on each of the first conductive layer 14 and the insulating layer 11, the stripping sheet 56 and the inversion support carrier 55 are stripped. Consequently, it is possible to easily remove the main part of the inversion support carrier 55. The lower surface of the first conductive layer 14 is exposed at the lower surface of the insulating layer 11. The lower surface of the insulating layer 11 and the lower surface of the first conductive layer 14 can be, for example, flush with each other.

Figure 14:
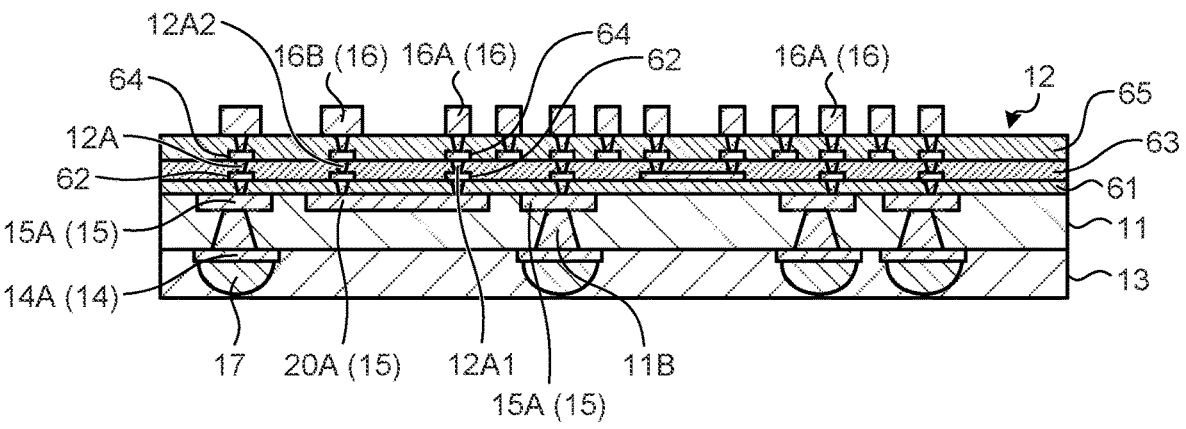
FIG. 14 is a diagram illustrating one example of a solder forming step.

FIG. 14 is a diagram illustrating one example of a solder forming step. At the step illustrated in FIG. 14, the solder layer 17 is formed on the lower surface of the first conductive layer 14 by performing a screen printing process or the like. The material and the thickness of the solder layer 17 are as described above. Then, the adhesive layer 13 that covers the solder layer 17 is formed on the lower surface of the insulating layer 11. The adhesive layer 13 can be formed by laminating a thermosetting resin film that has an insulation property and that is referred to as a NCF on, for example, the lower surface of the insulating layer 11 such that the thermosetting resin film covers the solder layer 17, and heating and hardening the adhesive layer 13. By performing the steps described above, the wiring substrate 5A has been completed. In addition, the solder layer 17 and the adhesive layer 13 are not component elements essential for the wiring substrate 5A, and may be formed when needed (for example, immediately before the wiring substrate 5A is mounted on the build-up substrate 2).

As a result, the wiring substrate 5A including the first conductive layer 14, the insulating layer 11, the second conductive layer 15, the thin film layer 12, and the third conductive layer 16 has been completed.

Figure 15:
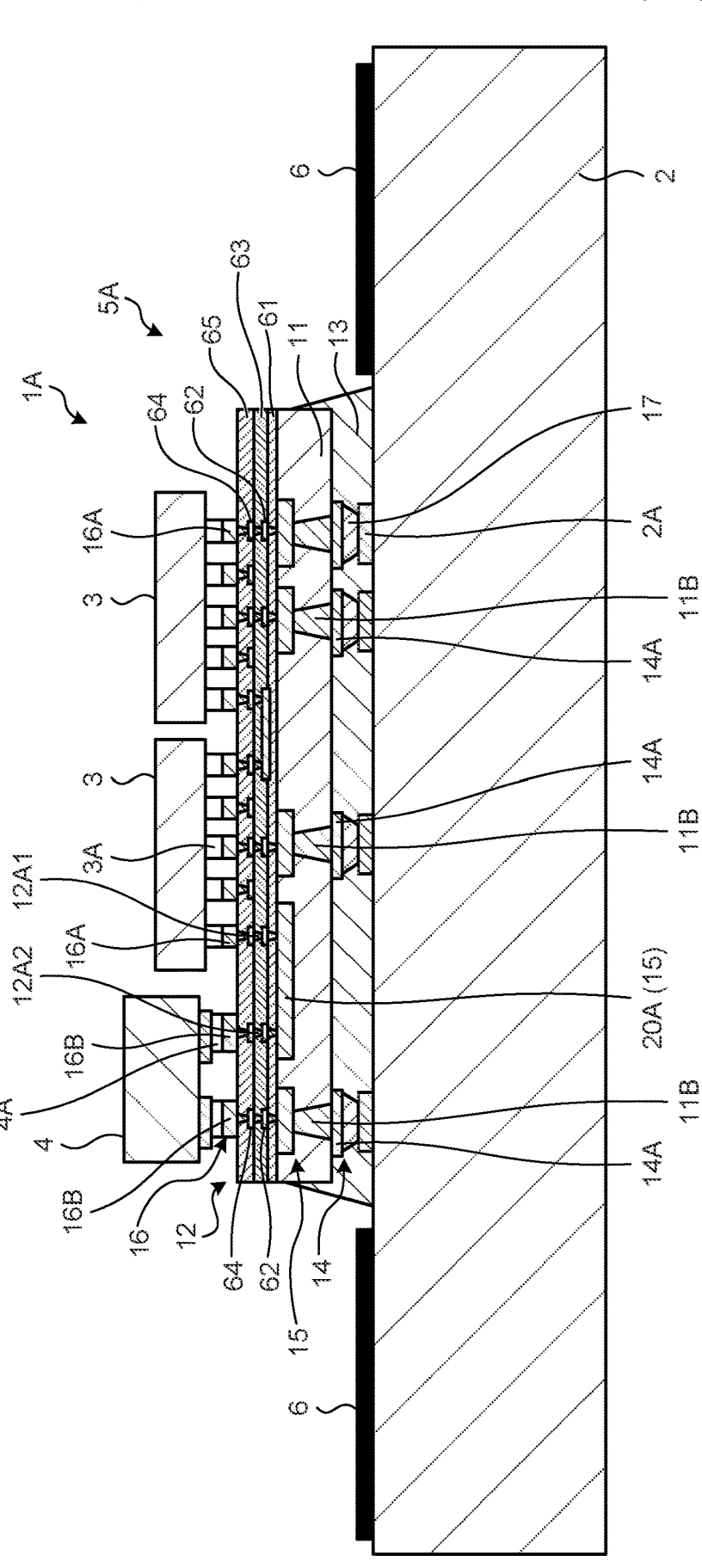
FIG. 15 is a diagram illustrating one example of a wiring substrate mounting step.
Figure 16:
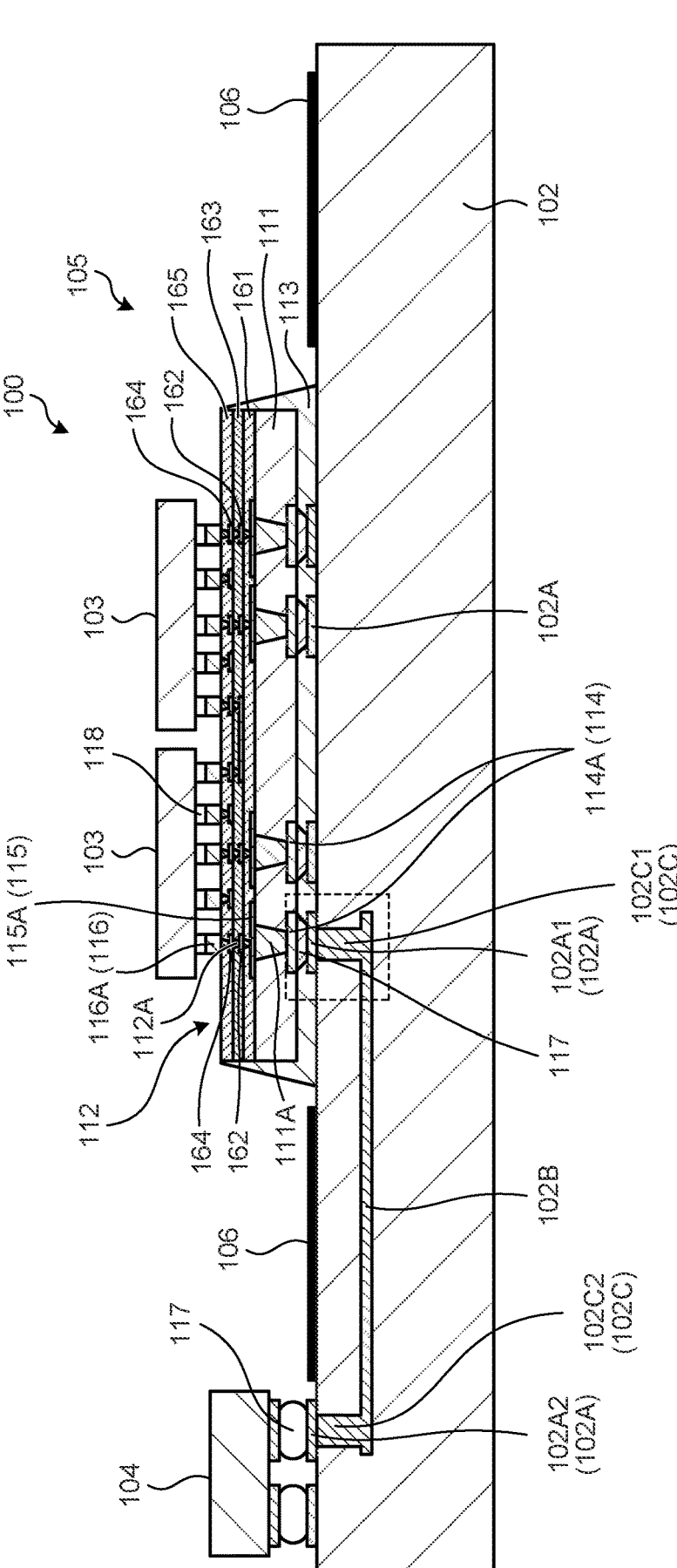
FIG. 16 is a diagram illustrating one example of a conventional semiconductor device.

FIG. 15 is a diagram illustrating one example of a wiring substrate mounting step. The plurality of pieces of the chips 3 and the connector 4 are mounted on the wiring substrate 5A as a flip chip mounting. The chip terminal 3A of the chip 3 is electrically connected to the first pad 16A included in the third conductive layer 16 included in the wiring substrate 5A by way of the solder bump 18. The connector terminal 4A of the connector 4 is electrically connected to the second pad 16B included in the third conductive layer 16 included in the wiring substrate 5A by way of the solder bump 18. The semiconductor device 1A is formed by electrically connecting, by way of the solder layer 17, the pad 14A included in the first conductive layer 14 in the wiring substrate 5A and the pad 2A disposed on the build-up substrate 2.

The wiring substrate 5A according to the second embodiment has been constituted such that the transmission wiring 20A is arranged in the second conductive layer 15 that is located at a boundary portion between the insulating layer 11 and the thin film layer 12. The transmission wiring 20A is buried in the insulating layer 11 so as to be in contact with the thin film layer 12. The thickness of the insulating layer 11 is thicker than the thickness of the insulating layer included in the thin film layer 12, so that it is possible to thicken the transmission wiring 20A. As a result, it is possible to reduce the wiring resistance of the transmission wiring 20A, so that it is possible to suppress an insertion loss and a reflection loss occurring when a high-speed signal passes through the transmission wiring 20A and it is thus possible to improve the transmission characteristic of the high-speed signal.

Furthermore, the dielectric loss tangent of the insulating layer 11 that includes the transmission wiring 20A is smaller than the dielectric loss tangent of the thin film layer 12. As a result, it is possible to suppress the insertion loss and the reflection loss produced when a high-speed signal passes through the transmission wiring 20A by the dielectric loss tangent, and it is thus possible to improve the transmission characteristic of the high-speed signal.

The transmission wiring 20A is formed by using the same step as that used for the pad 15A at the time at which the second conductive layer 15 is formed. Consequently, it is possible to easily form the transmission wiring 20A.

In the present embodiment, a case has been described as an example in which the structure is applied to an interposer substrate; however, the example is not limited to this, and, for example, it may be possible to use a structure constituted such that insulating layers and thin film layers are sequentially laminated on a core substrate, and a plurality of pad that are formed on the thin film layer. As a result, it is possible to obtain the same effects by forming transmission wiring to have a thick wiring layer disposed in the insulating layer.

In addition, the first via 12A1 and the second via 12A2 each of which has via wiring that is electrically connected to the transmission wiring 20 may have a diameter that is larger than the other via that is formed in the thin film layer. By doing so, it is possible to reduce an insertion loss of a high-speed signal via transmission wiring.

In one embodiment as described above, a method of manufacturing a wiring substrate that includes a first insulating layer, a first wiring layer that is formed on the first insulating layer, a first conductive layer that is included in the first wiring layer and that is formed on one of surfaces of the first insulating layer, a second conductive layer that is included in the first wiring layer and that is formed on the other of the surfaces of the first insulating layer, a thin film layer that includes a second insulating layer that is different from the first insulating layer and a second wiring layer that are formed on the one of the surfaces of the first insulating layer, and a third conductive layer that is formed on a surface located at a side opposite to the surface that faces the first insulating layer, the method of manufacturing the wiring substrate comprising:

a step of forming the first insulating layer such that a wiring thickness of the first insulating layer is thicker than a wiring thickness of the second insulating layer;

a step of forming the thin film layer by forming a first pad and a second pad that are provided on an opposite surface of a surface that faces the first insulating layer, a first via that is electrically connected to the first pad, and a second via that is electrically connected to the second pad; and a step of forming, in one of the first conductive layer or the second conductive layer, a transmission wiring that electrically connects between the first via and the second via.

According to one aspect of an embodiment of the wiring substrate disclosed in the present application, it is possible to reduce a reflection loss and an insertion loss when a high-speed signal is transmitted.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring substrate comprising:

a first insulating layer that is formed of a non-photosensitive thermosetting resin as a main component and is a single layer;

a first wiring layer that is provided on the first insulating layer; and a thin film layer that is provided on one of surfaces of the first insulating layer and that includes a plurality of second wiring layers and a plurality of second insulating layers that is different from the first insulating layer and is formed of a photosensitive thermosetting resin as a main component, in which the plurality of second wiring layers and the plurality of second insulating layers are sequentially laminated, wherein the thin film layer includes a first pad and a second pad that are provided on an opposite surface of a surface that faces the first insulating layer, a first via that is electrically connected to the first pad, and a second via that is electrically connected to the second pad, the first wiring layer includes a first conductive layer that is formed on a lower surface of the first insulating layer and is covered by the first insulating layer, and a second conductive layer that is formed on an upper surface of the first insulating layer and is covered by one of the plurality of second insulating layers, the first conductive layer being thicker than the second conductive layer and the plurality of the second wiring layers, the first insulating layer includes a third via that electrically connects the first conductive layer and the second conductive layer and has an inverted truncated cone shape that tapers in diameter from the upper surface to the lower surface of the first insulating layer, the first wiring layer includes a transmission wiring that electrically connects between the first via and the second via, and a dielectric loss tangent of the first insulating layer that includes the transmission wiring is smaller than a dielectric loss tangent of the plurality of second insulating layers that are included in the thin film layer.

2. The wiring substrate according to claim 1, wherein a wiring thickness of the first conductive layer in the first wiring layer is within a range of 10 to 20 μm, and a wiring thickness of each of the second conductive layer in the first wiring layer and the plurality of second wiring layers is within a range of 1 to 3 μm.

3. The wiring substrate according to claim 1, wherein the transmission wiring is a wiring that transmits a high-speed serial signal between the first via and the second via.

4. The wiring substrate according to claim 1, wherein the thin film layer includes a third conductive layer that is formed on a surface located at a side opposite to the surface that faces the first insulating layer, and the thin film layer includes the first via and the second via that electrically connect the second conductive layer and the third conductive layer.

5. The wiring substrate according to claim 1, wherein the transmission wiring is formed in the first conductive layer.

6. The wiring substrate according to claim 1, wherein the dielectric loss tangent of the first insulating layer is within a range of 0.0004 to 0.02.

7. The wiring substrate according to claim 1, wherein the first wiring layer is thicker than the second wiring layer so as to reduce a wiring resistance of the transmission wiring so that it is possible to suppress an insertion loss and a reflection loss occurring when a high-speed signal passes through the transmission wiring.

8. A semiconductor device comprising:

a wiring substrate on which a first electronic component and a second electronic component are mounted; and a multi-layer wiring substrate on which the wiring substrate is mounted, wherein the wiring substrate includes a first insulating layer that is formed of a non-photosensitive thermosetting resin as a main component and is a single layer, a first wiring layer that is provided on the first insulating layer, and a thin film layer that is provided on one of surfaces of the first insulating layer and that includes a plurality of second wiring layers and a plurality of second insulating layers that is different from the first insulating layer and is formed of a photosensitive thermosetting resin as a main component, in which the plurality of second wiring layers and the plurality of second insulating layers are sequentially laminated, the thin film layer includes a first pad and a second pad that are provided on an opposite surface of a surface that faces the first insulating layer, a first via that is electrically connected to the first pad that is connected to the first electronic component, and a second via that is electrically connected to the second pad that is connected to the second electronic component, the first wiring layer includes a first conductive layer that is formed on a lower surface of the first insulating layer and is covered by the first insulating layer, and a second conductive layer that is formed on an upper surface of the first insulating layer and is covered by the plurality of second insulating layers, the first conductive layer being thicker than the second conductive layer and the plurality of the second wiring layers, the first insulating layer includes a third via that electrically connects the first conductive layer and the second conductive layer and has an inverted truncated cone shape that tapers in diameter from the upper surface to the lower surface of the first insulating layer, the first wiring layer includes a transmission wiring that electrically connects between the first via and the second via, and a dielectric loss tangent of the first insulating layer that includes the transmission wiring is smaller than a dielectric loss tangent of the plurality of second insulating layers that are included in the thin film layer.

\* \* \* \* \*